US008395937B2

(12) United States Patent
Fisch et al.

(10) Patent No.: US 8,395,937 B2
(45) Date of Patent: *Mar. 12, 2013

(54) INTEGRATED CIRCUIT INCLUDING MEMORY ARRAY HAVING A SEGMENTED BIT LINE ARCHITECTURE AND METHOD OF CONTROLLING AND/OR OPERATING SAME

(75) Inventors: David Fisch, St-Sulpice (CH); Michel Bron, Lausanne (CH)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/166,291

(22) Filed: Jun. 22, 2011

(65) Prior Publication Data

US 2011/0249499 A1    Oct. 13, 2011

Related U.S. Application Data

(60) Continuation of application No. 12/467,331, filed on May 18, 2009, now Pat. No. 7,969,779, which is a division of application No. 11/821,848, filed on Jun. 26, 2007, now Pat. No. 7,542,340.

(60) Provisional application No. 60/830,084, filed on Jul. 11, 2006.

(51) Int. Cl.
  *G11C 11/34*    (2006.01)
(52) U.S. Cl. ......... 365/185.05; 365/185.11; 365/185.17; 365/185.13; 365/185.12; 365/63
(58) Field of Classification Search ............ 365/185.05, 365/185.11, 185.17, 185.13, 185.12, 63
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |

(Continued)

FOREIGN PATENT DOCUMENTS

| EP | 0 030 856 | 6/1981 |
|---|---|---|
| EP | 0 350 057 | 1/1990 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Viet Q Nguyen
(74) *Attorney, Agent, or Firm* — Wilmer Cutler Pickering Hale and Dorr LLP

(57) ABSTRACT

An integrated circuit device (e.g., a logic device or a memory device) having a memory cell array including a plurality of bit lines (e.g., first and second bit lines) and a plurality of bit line segments (e.g., first and second bit line segments) wherein each bit line segment is selectively and responsively coupled to or decoupled from its associated bit line via an associated isolation circuit. The memory cell array further includes a plurality of memory cells, wherein each memory cell includes a transistor having a first region, a second region, a body region, and a gate coupled to an associated word line via an associated word line segment. A first group of memory cells is coupled to the first bit line via the first bit line segment and a second group of memory cells is coupled to the second bit line via the second bit line segment. A plurality of isolation circuits, disposed between each bit line segment and its associated bit line, to responsively couple the associated bit line segment to or disconnect the associated bit line segment from the associated bit line.

22 Claims, 35 Drawing Sheets

U.S. PATENT DOCUMENTS

| | | |
|---|---|---|
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,796,671 A | 8/1998 | Wahlstrom |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,373,748 B2 | 4/2002 | Ikehashi et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,430,077 B1 | 8/2002 | Eitan et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,445,612 B1 | 9/2002 | Naji |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B2 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,909,639 B2 | 6/2005 | Park et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |

| | | | | | |
|---|---|---|---|---|---|
| 7,041,538 B2 | 5/2006 | Ieong et al. | 2005/0121710 A1 | 6/2005 | Shino |
| 7,042,765 B2 | 5/2006 | Sibigtroth et al. | 2005/0135169 A1 | 6/2005 | Somasekhar et al. |
| 7,061,806 B2 | 6/2006 | Tang et al. | 2005/0141262 A1 | 6/2005 | Yamada et al. |
| 7,085,153 B2 | 8/2006 | Ferrant et al. | 2005/0141290 A1 | 6/2005 | Tang et al. |
| 7,085,156 B2 | 8/2006 | Ferrant et al. | 2005/0145886 A1 | 7/2005 | Keshavarzi et al. |
| 7,170,807 B2 | 1/2007 | Fazan et al. | 2005/0145935 A1 | 7/2005 | Keshavarzi et al. |
| 7,177,175 B2 | 2/2007 | Fazan et al. | 2005/0167751 A1 | 8/2005 | Nakajima et al. |
| 7,187,581 B2 | 3/2007 | Ferrant et al. | 2005/0189576 A1 | 9/2005 | Ohsawa |
| 7,230,846 B2 | 6/2007 | Keshavarzi | 2005/0208716 A1 | 9/2005 | Takaura et al. |
| 7,233,024 B2 | 6/2007 | Scheuerlein et al. | 2005/0226070 A1 | 10/2005 | Ohsawa |
| 7,256,459 B2 | 8/2007 | Shino | 2005/0232043 A1 | 10/2005 | Ohsawa |
| 7,289,369 B2 | 10/2007 | Matick et al. | 2005/0242396 A1 | 11/2005 | Park et al. |
| 7,301,803 B2 | 11/2007 | Okhonin et al. | 2006/0043484 A1 | 3/2006 | Cabral et al. |
| 7,301,838 B2 | 11/2007 | Waller | 2006/0084247 A1 | 4/2006 | Liu |
| 7,317,641 B2 | 1/2008 | Scheuerlein | 2006/0091462 A1 | 5/2006 | Okhonin et al. |
| 7,324,387 B1 | 1/2008 | Bergemont et al. | 2006/0098481 A1 | 5/2006 | Okhonin et al. |
| 7,335,934 B2 | 2/2008 | Fazan | 2006/0104102 A1 | 5/2006 | Choi et al. |
| 7,341,904 B2 | 3/2008 | Willer | 2006/0126374 A1 | 6/2006 | Waller et al. |
| 7,388,774 B1 * | 6/2008 | Kim ............................. 365/154 | 2006/0131650 A1 | 6/2006 | Okhonin et al. |
| 7,416,943 B2 | 8/2008 | Figura et al. | 2006/0223302 A1 | 10/2006 | Chang et al. |
| 7,456,439 B1 | 11/2008 | Horch | 2007/0008811 A1 | 1/2007 | Keeth et al. |
| 7,477,540 B2 | 1/2009 | Okhonin et al. | 2007/0023833 A1 | 2/2007 | Okhonin et al. |
| 7,492,632 B2 | 2/2009 | Carman | 2007/0045709 A1 | 3/2007 | Yang |
| 7,517,744 B2 | 4/2009 | Mathew et al. | 2007/0058427 A1 | 3/2007 | Okhonin et al. |
| 7,539,041 B2 | 5/2009 | Kim et al. | 2007/0064489 A1 | 3/2007 | Bauser |
| 7,542,340 B2 * | 6/2009 | Fisch et al. ............... 365/185.05 | 2007/0085140 A1 | 4/2007 | Bassin |
| 7,542,345 B2 | 6/2009 | Okhonin et al. | 2007/0097751 A1 | 5/2007 | Popoff et al. |
| 7,545,694 B2 | 6/2009 | Srinivasa Raghavan et al. | 2007/0114599 A1 | 5/2007 | Hshieh |
| 7,606,066 B2 | 10/2009 | Okhonin et al. | 2007/0133330 A1 | 6/2007 | Ohsawa |
| 7,619,944 B2 * | 11/2009 | Fisch et al. .................... 365/222 | 2007/0138524 A1 | 6/2007 | Kim et al. |
| 7,696,032 B2 | 4/2010 | Kim et al. | 2007/0138530 A1 | 6/2007 | Okhonin et al. |
| 7,969,779 B2 * | 6/2011 | Fisch et al. ............... 365/185.05 | | | |
| 2001/0055859 A1 | 12/2001 | Yamada et al. | | FOREIGN PATENT DOCUMENTS | |
| 2002/0030214 A1 | 3/2002 | Horiguchi | EP | 0 354 348 | 2/1990 |
| 2002/0034855 A1 | 3/2002 | Horiguchi et al. | EP | 0 202 515 | 3/1991 |
| 2002/0036322 A1 | 3/2002 | Divakauni et al. | EP | 0 207 619 | 8/1991 |
| 2002/0051378 A1 | 5/2002 | Ohsawa | EP | 0 175 378 | 11/1991 |
| 2002/0064913 A1 | 5/2002 | Adkisson et al. | EP | 0 253 631 | 4/1992 |
| 2002/0070411 A1 | 6/2002 | Vermandel et al. | EP | 0 513 923 | 11/1992 |
| 2002/0072155 A1 | 6/2002 | Liu et al. | EP | 0 300 157 | 5/1993 |
| 2002/0076880 A1 | 6/2002 | Yamada et al. | EP | 0 564 204 | 10/1993 |
| 2002/0086463 A1 | 7/2002 | Houston et al. | EP | 0 579 566 | 1/1994 |
| 2002/0089038 A1 | 7/2002 | Ning | EP | 0 362 961 | 2/1994 |
| 2002/0098643 A1 | 7/2002 | Kawanaka et al. | EP | 0 599 506 | 6/1994 |
| 2002/0110018 A1 | 8/2002 | Ohsawa | EP | 0 359 551 | 12/1994 |
| 2002/0114191 A1 | 8/2002 | Iwata et al. | EP | 0 366 882 | 5/1995 |
| 2002/0130341 A1 | 9/2002 | Horiguchi et al. | EP | 0 465 961 | 8/1995 |
| 2002/0160581 A1 | 10/2002 | Watanabe et al. | EP | 0 694 977 | 1/1996 |
| 2002/0180069 A1 | 12/2002 | Houston | EP | 0 333 426 | 7/1996 |
| 2003/0003608 A1 | 1/2003 | Arikado et al. | EP | 0 727 820 | 8/1996 |
| 2003/0015757 A1 | 1/2003 | Ohsawa | EP | 0 739 097 | 10/1996 |
| 2003/0035324 A1 | 2/2003 | Fujita et al. | EP | 0 245 515 | 4/1997 |
| 2003/0042516 A1 | 3/2003 | Forbes et al. | EP | 0 788 165 | 8/1997 |
| 2003/0047784 A1 | 3/2003 | Matsumoto et al. | EP | 0 801 427 | 10/1997 |
| 2003/0057487 A1 | 3/2003 | Yamada et al. | EP | 0 510 607 | 2/1998 |
| 2003/0057490 A1 | 3/2003 | Nagano et al. | EP | 0 537 677 | 8/1998 |
| 2003/0102497 A1 | 6/2003 | Fried et al. | EP | 0 858 109 | 8/1998 |
| 2003/0112659 A1 | 6/2003 | Ohsawa | EP | 0 860 878 | 8/1998 |
| 2003/0123279 A1 | 7/2003 | Aipperspach et al. | EP | 0 869 511 | 10/1998 |
| 2003/0146474 A1 | 8/2003 | Ker et al. | EP | 0 878 804 | 11/1998 |
| 2003/0146488 A1 | 8/2003 | Nagano et al. | EP | 0 920 059 | 6/1999 |
| 2003/0151112 A1 | 8/2003 | Yamada et al. | EP | 0 924 766 | 6/1999 |
| 2003/0231521 A1 | 12/2003 | Ohsawa | EP | 0 642 173 | 7/1999 |
| 2004/0021137 A1 | 2/2004 | Fazan et al. | EP | 0 727 822 | 8/1999 |
| 2004/0021179 A1 | 2/2004 | Lee | EP | 0 933 820 | 8/1999 |
| 2004/0029335 A1 | 2/2004 | Lee et al. | EP | 0 951 072 | 10/1999 |
| 2004/0075143 A1 | 4/2004 | Bae et al. | EP | 0 971 360 | 1/2000 |
| 2004/0108532 A1 | 6/2004 | Forbes et al. | EP | 0 980 101 | 2/2000 |
| 2004/0188714 A1 | 9/2004 | Scheuerlein et al. | EP | 0 601 590 | 4/2000 |
| 2004/0217420 A1 | 11/2004 | Yeo et al. | EP | 0 993 037 | 4/2000 |
| 2005/0001257 A1 | 1/2005 | Schloesser et al. | EP | 0 836 194 | 5/2000 |
| 2005/0001269 A1 | 1/2005 | Hayashi et al. | EP | 0 599 388 | 8/2000 |
| 2005/0017240 A1 | 1/2005 | Fazan | EP | 0 689 252 | 8/2000 |
| 2005/0047240 A1 | 3/2005 | Ikehashi et al. | EP | 0 606 758 | 9/2000 |
| 2005/0062088 A1 | 3/2005 | Houston | EP | 0 682 370 | 9/2000 |
| 2005/0063224 A1 | 3/2005 | Fazan et al. | EP | 1 073 121 | 1/2001 |
| 2005/0064659 A1 | 3/2005 | Willer | EP | 0 726 601 | 9/2001 |
| 2005/0105342 A1 | 5/2005 | Tang et al. | EP | 0 731 972 | 11/2001 |
| 2005/0111255 A1 | 5/2005 | Tang et al. | EP | 1 162 663 | 12/2001 |

| | | |
|---|---|---|
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| JP | WO 2005/008778 | 1/2005 |
| WO | WO 01/24268 | 4/2001 |

OTHER PUBLICATIONS

Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06, International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. on El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multi-functional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM C8ell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. on El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Giga—bit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. on El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562 μ m2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAMO® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, Isscc.

Sailing et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. on El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED'02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Villaret et al., "Mechanisms of Charge Modulation in the Floating Body of Triple-Well nMOSFET Capacitor-less DRAMs",Handout at Proceedings of the INFOS 2003, Jun. 18-20, 2003, Barcelona (Spain), (2 pages).

D.A. Puckhell et al., "Basic VLSI Design," Prentice Hall, Australia, pp. 100 (1988).

European Office action mailed on Nov. 28, 2011 for European Application No. 07810300.9 filed Jul. 10, 2007 (6 pages).

* cited by examiner

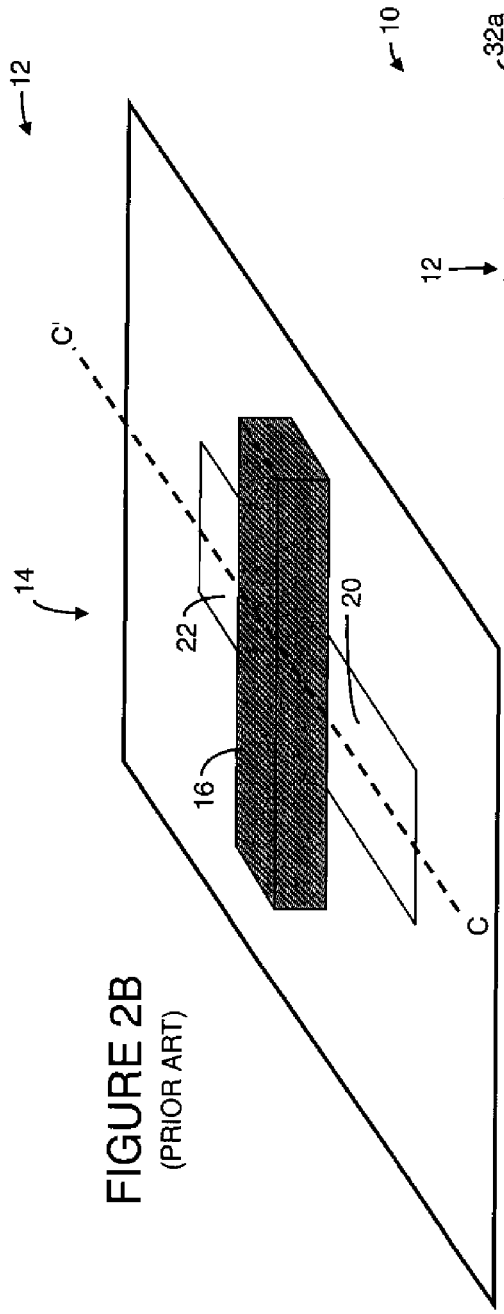
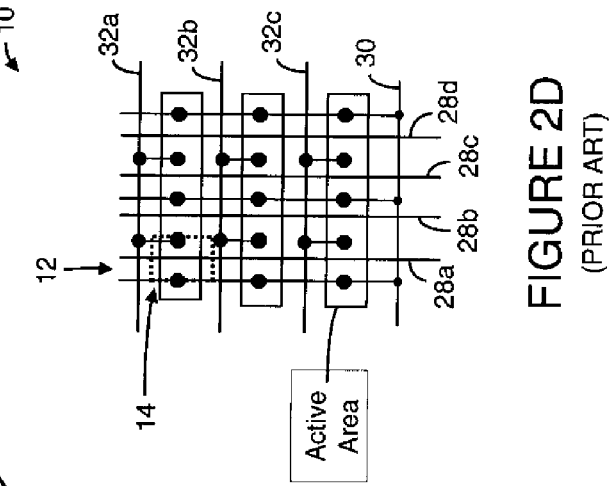
FIGURE 2D
(PRIOR ART)
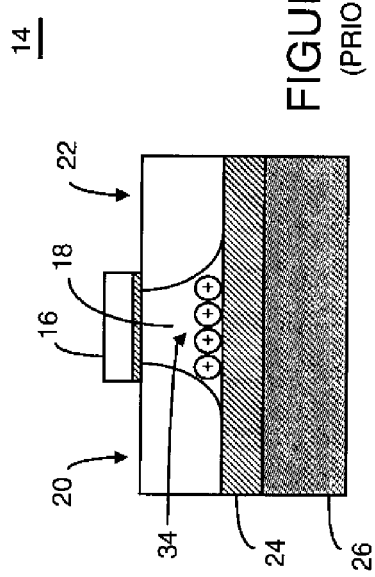
FIGURE 2C
(PRIOR ART)
FIGURE 2B
(PRIOR ART)

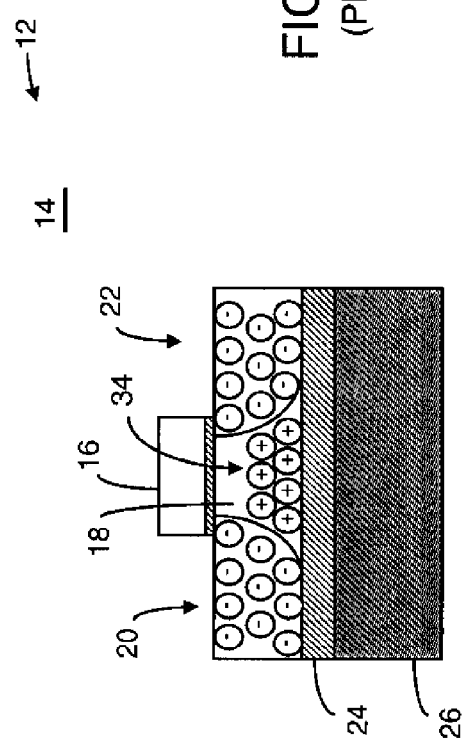
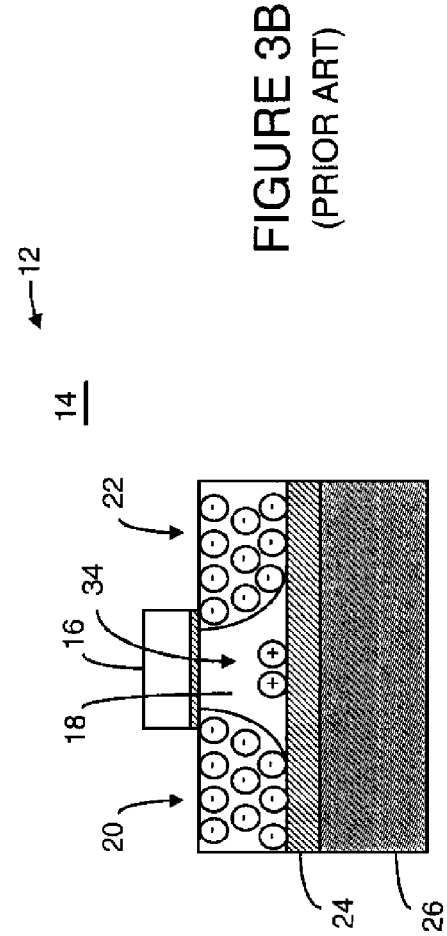

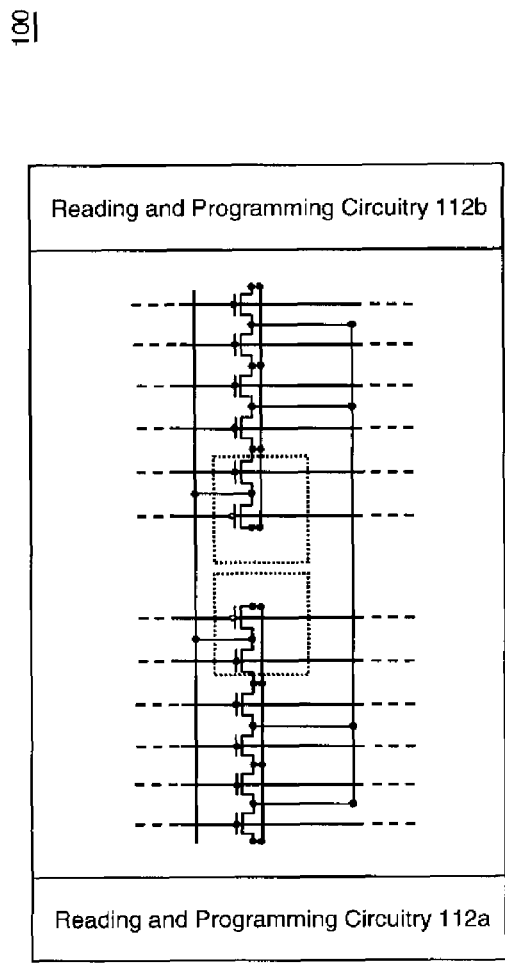

INTEGRATED CIRCUIT INCLUDING MEMORY ARRAY HAVING A SEGMENTED BIT LINE ARCHITECTURE AND METHOD OF CONTROLLING AND/OR OPERATING SAME

RELATED APPLICATION

This application is a continuation application of U.S. patent application Ser. No. 12/467,331, filed May 18, 2009, entitled "Integrated Circuit Including Memory Array Having a Segmented Bit Line Architecture and Method of Controlling and/or Operating Same," which is a divisional application of U.S. patent application Ser. No. 11/821,848, filed Jun. 26, 2007, entitled "Integrated Circuit Including Memory Array Having a Segmented Bit Line Architecture and Method of Controlling and/or Operating Same," which claims priority to U.S. Provisional Application No. 60/830,084, entitled "Integrated Circuit Having Memory Array having a Segmented Bit Line Architecture, and Method of Controlling and/or Operating Same", filed Jul. 11, 2006, each of which is incorporated by reference herein in its entirety.

BACKGROUND

In one aspect, the present inventions described and illustrated herein relate to an integrated circuit device having a memory cell array including a plurality of rows and columns, and techniques for controlling and/or operating such a device. More particularly, in one aspect, the present inventions relate to an integrated circuit having memory cell array including a plurality of bit lines and a plurality of bit line segments, wherein a plurality of bit line segments are associated with each bit line, and wherein each bit line segment includes a plurality of memory cells (for example, memory cells having an electrically floating body in which a charge is stored) associated therewith and connected thereto; isolation circuits selectively and responsively couple an associated bit line segment to an associated bit line.

Briefly, with reference to FIG. 1, memory cell array 10 typically includes a plurality of memory cells 12 arranged in a matrix of rows and columns. A row address decoder enables one or more rows to be read by sensing circuitry (for example, a plurality of sense amplifiers). A column decoder, in response to an address, selects one or more of the outputs of the data sensing circuitry.

One type of dynamic random access memory cell is based on, among other things, a floating body effect of SOI transistors. (See, for example, U.S. Pat. No. 6,969,662). In this regard, the memory cell may consist of a partially depleted (PD) or a fully depleted (FD) SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of cell is determined by the concentration of charge in the body of the transistor.

With reference to FIGS. 2A, 2B, 2C and 2D, memory cell array 10 may include a plurality of memory cells 12, each consisting of transistor 14 having gate 16, an electrically floating body region 18, source region 20 and drain region 22. The body region 18 is disposed between source region 20 and drain region 22. Moreover, body region 18 is disposed on or above region 24, which may be an insulation region (for example, in SOI material) or non-conductive region (for example, in bulk-type material). The insulation or non-conductive region may be disposed on substrate 26.

Data is written into or read from a selected memory cell by applying suitable control signals to a selected word line(s) 28, and/or a selected bit line(s) 32. The source line (30) is a common node in a typical implementation though it could be similarly decoded. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

As mentioned above, memory cell 12 of memory cell array 10 operates by accumulating in or emitting/ejecting majority carriers (electrons or holes) 34 from body region 18 of, for example, N-channel transistors. (See, FIGS. 3A and 3B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 3A). Emitting or ejecting majority carriers 34 from body region 18 via, for example, forward biasing the source/body junction and/or the drain/body junction, is representative of a logic low or "0" data state. (See, FIG. 3B).

Notably, an advantage of the floating body memory cell compared to a more traditional DRAM cell (i.e., one transistor and one capacitor) is that the floating body memory cell does not require an associated capacitor to store charge. This tends to reduce process complexity and provide a smaller memory cell footprint. In this way, the cost of a memory cell array implementing such memory cells is less than conventional memory cell arrays.

Another significant concern in memory cell arrays is power consumption. The need for products with reduced power consumption is particularly acute due to proliferation of battery powered products. With the floating body memory, one source of power consumption is the power consumed during refresh operations. A refresh operation involves reading the state of a cell and re-writing that cell to the state that was read. This may be necessary as a result of gradual loss of charge over time in the floating body. The rate of charge loss increases in a floating body array when disturb voltages are applied to the nodes of a given cell. These disturb voltages occur in an array when reads and writes are made to rows in a shared array. The unselected row remains with its gate off, but its drain nodes are "exposed" to changing voltages due to the voltages applied to the shared bit line.

Notably, the above mentioned disturb voltage tends to reduce the refresh interval necessary to maintain stored data and thus, increase the power consumption required to maintain stored data.

SUMMARY OF INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to an integrated circuit device (for example, logic device or discrete memory device) comprising a memory cell array including (1) a plurality of bit lines, (2) a plurality of bit line segments, wherein at least two bit line segments are associated with each bit line and wherein each bit line segment is selectively and responsively coupled to or decoupled from its associated bit line, (3) a plurality of word lines, and (4) a plurality of memory cells, wherein each memory cell stores at least two data states and includes a transistor. Each transistor of each memory cell includes a first region connected to an associated bit line segment, a second region, a body region disposed between the first region and the second region, and a gate disposed over the body region and coupled to an associated word line. The integrated circuit device includes a first group of memory cells is coupled to a first bit line via a first bit line segment, a second group of memory cells is coupled to the first bit line via a second bit line segment, a third group of memory cells is coupled to a second bit line via a third bit line segment, and a fourth group of memory cells is coupled to the second bit line via a fourth bit line segment. The integrated circuit device of certain aspects of the inventions also includes first circuitry, coupled to the first and second bit lines, to sense the data state stored in the memory cells of the first, second, third and fourth groups of memory cells.

In one embodiment, the integrated circuit device may include a plurality of isolation circuits, wherein each isolation circuit is associated with a bit line segment and wherein each isolation circuit is disposed between the associated bit line segment and the associated bit line thereof. The isolation circuit responsively connects the associated bit line segment to or disconnects the associated bit line segment from the associated bit line.

In one embodiment, each isolation circuit includes a first transistor (P-type or an N-type transistor) comprising: (i) a first region connected to the associated bit line, (ii) a second region connected to the associated bit line segment, (iii) a body region disposed between the first region and the second region, and (iv) a gate disposed over the body region and configured to receive a control signal. In another embodiment, each isolation circuit further includes a second transistor (P-type or an N-type transistor) comprising: (i) a first region connected to the associated bit line segment, (ii) a second region connected to a predetermined voltage, (iii) a body region disposed between the first region and the second region, and (iv) a gate disposed over the body region and configured to receive a control signal.

In another embodiment, each isolation circuit includes a plurality of transistors including a first transistor and a second transistor, wherein the first and second transistors are arranged in a CMOS configuration. The isolation circuit may further include a third transistor comprising: (i) a first region connected to the associated bit line segment, (ii) a second region connected to a predetermined voltage, (iii) a body region disposed between the first region and the second region, and (iv) a gate disposed over the body region and configured to receive a control signal.

In yet another embodiment of this aspect of the inventions, the integrated circuit device further includes a plurality of isolation circuits, wherein each isolation circuit is associated with a bit line segment and wherein each isolation circuit is disposed between the associated bit line segment and the associated bit line thereof. The plurality of isolation circuit includes first isolation circuit is disposed between the first bit line segment and the first bit line, a second isolation circuit is disposed between the second bit line segment and the first bit line. The first and second isolation circuits each include a transistor comprising: (i) a first region connected to the first bit line, (ii) a second region connected to the associated bit line segment, (iii) a body region disposed between the first region and the second region, and (iv) a gate disposed over the body region and configured to receive a control signal, wherein the transistors of the first and second isolation circuits share the first region. In one embodiment, the transistors of the first and second isolation circuits include P-type transistors or N-type transistors. The first and second isolation circuits may each further include a clamp transistor comprising: (i) a first region connected to the associated bit line segment, (ii) a second region connected to a predetermined voltage, (iii) a body region disposed between the first region and the second region, and (iv) a gate disposed over the body region and configured to receive a control signal.

In one embodiment, the number of memory cells in each of the first, second, third and fourth groups of memory cells may be equal to or greater than two. In another embodiment, the number of memory cells in each of the first, second, third and fourth groups of memory cells is equal to or greater than four.

In another principle aspect, certain of the present inventions are directed to an integrated circuit device (for example, logic device or discrete memory device) comprising a memory cell array, including a plurality of bit lines, a plurality of bit line segments, wherein at least two bit line segments are associated with each bit line and wherein each bit line segment is selectively and responsively coupled to or decoupled from associated bit line, a plurality of word lines, and a plurality of isolation circuits, wherein an isolation circuit is disposed between an associated bit line segment and associated bit line thereof, and wherein the isolation circuit responsively connects the associated bit line segment to or disconnects the associated bit line segment from the associated bit line. In this aspect, a plurality of memory cells are arranged in groups wherein each group of memory cells is connected to an associated bit line segment, and wherein each memory cell stores at least two data states which are representative of an amount of charge in the body region, each memory cell includes a transistor. Each transistor includes a first region connected to an associated bit line segment, a second region, a body region disposed between the first region and the second region, wherein the body region is electrically floating, and a gate disposed over the body region and coupled to an associated word line. The integrated circuit device of this aspect of the inventions also includes first circuitry, coupled to bit lines, to sense the data state stored in the memory cells.

In one embodiment, each isolation circuit includes a first transistor (a P-type or an N-type transistor) comprising: (i) a first region connected to the associated bit line, (ii) a second region connected to the associated bit line segment, (iii) a body region disposed between the first region and the second region, wherein the body region is electrically floating, and (iv) a gate disposed over the body region and configured to receive a control signal. Each isolation circuit may further include a second transistor (a P-type or an N-type transistor) comprising: (i) a first region connected to the associated bit line segment, (ii) a second region connected to a predetermined voltage, (iii) a body region disposed between the first region and the second region, wherein the body region is electrically floating, and (iv) a gate disposed over the body region and configured to receive a control signal.

In another embodiment, each isolation circuit may include a plurality of transistors including a first transistor and a second transistor which are arranged in a CMOS configuration. The isolation circuits of this embodiment may each also include a third transistor comprising: (i) a first region connected to the associated bit line segment, (ii) a second region connected to a predetermined voltage, (iii) a body region disposed between the first region and the second region, wherein the body region is electrically floating, and (iv) a gate disposed over the body region and configured to receive a control signal.

In one embodiment, the number of memory cells in each group of memory cells may be equal to or greater than two. In another embodiment, the number of memory cells in each of group of memory cells is equal to or greater than four. Indeed, in yet another embodiment, the number of memory cells in each of group of memory cells may be odd or even.

In another principle aspect, certain of the present inventions are directed to an integrated circuit device (for example, logic device or discrete memory device) comprising a memory cell array including a plurality of bit lines, a plurality of bit line segments, wherein at least two bit line segments are associated with each bit line and wherein each bit line segment is selectively and responsively coupled to or decoupled from its associated bit line, a plurality of word lines and a plurality of isolation circuits, wherein an isolation circuit is disposed between each bit line segment and its associated bit line, and wherein the isolation circuit responsively connects the associated bit line segment to or disconnects the associated bit line segment from the associated bit line. The memory cell array also includes a plurality of memory cells, wherein each is connected to an associated bit line segment, stores at least two data state and consists essentially of a transistor, wherein each transistor includes a first region connected to an associated bit line segment, a second region, a body region disposed between the first region and the second region, wherein the body region is electrically floating and a gate disposed over the body region and coupled to an associated word line. A first group of memory cells is coupled to a first bit line via a first bit line segment. A second group of memory cells is coupled to the first bit line via a second bit line segment. A third group of memory cells is coupled to a second bit line via a third bit line segment. A fourth group of memory cells is coupled to the second bit line via a fourth bit line segment. The integrated circuit device of this aspect of the inventions further first circuitry, coupled to the first and second bit lines, to sense the data state stored in the memory cells of the first, second, third and fourth groups.

In one embodiment, the integrated circuit device may include a plurality of isolation circuits, wherein each isolation circuit is associated with a bit line segment and wherein each isolation circuit is disposed between the associated bit line segment and the associated bit line thereof. The isolation circuit responsively connects the associated bit line segment to or disconnects the associated bit line segment from the associated bit line.

In one embodiment, each isolation circuit includes a first transistor (P-type or an N-type transistor) comprising: (i) a first region connected to the associated bit line, (ii) a second region connected to the associated bit line segment, (iii) a body region disposed between the first region and the second region, and (iv) a gate disposed over the body region and configured to receive a control signal. In another embodiment, each isolation circuit further includes a second transistor (P-type or an N-type transistor) comprising: (i) a first region connected to the associated bit line segment, (ii) a second region connected to a predetermined voltage, (iii) a body region disposed between the first region and the second region, and (iv) a gate disposed over the body region and configured to receive a control signal.

In another embodiment, each isolation circuit includes a plurality of transistors including a first transistor and a second transistor, wherein the first and second transistors are arranged in a CMOS configuration. The isolation circuit may further include a third transistor comprising: (i) a first region connected to the associated bit line segment, (ii) a second region connected to a predetermined voltage, (iii) a body region disposed between the first region and the second region, and (iv) a gate disposed over the body region and configured to receive a control signal.

In yet another embodiment of this aspect of the inventions, the integrated circuit device further includes a plurality of isolation circuits, wherein each isolation circuit is associated with a bit line segment and wherein each isolation circuit is disposed between the associated bit line segment and the associated bit line thereof. The plurality of isolation circuit includes first isolation circuit is disposed between the first bit line segment and the first bit line, a second isolation circuit is disposed between the second bit line segment and the first bit line. The first and second isolation circuits each include a transistor comprising: (i) a first region connected to the first bit line, (ii) a second region connected to the associated bit line segment, (iii) a body region disposed between the first region and the second region, and (iv) a gate disposed over the body region and configured to receive a control signal, wherein the transistors of the first and second isolation circuits share the first region. In one embodiment, the transistors of the first and second isolation circuits include P-type transistors or N-type transistors. The first and second isolation circuits may each further include a clamp transistor comprising: (i) a first region connected to the associated bit line segment, (ii) a second region connected to a predetermined voltage, (iii) a body region disposed between the first region and the second region, and (iv) a gate disposed over the body region and configured to receive a control signal.

In one embodiment, the number of memory cells in each of the first, second, third and fourth groups of memory cells may be equal to or greater than two. In another embodiment, the number of memory cells in each of the first, second, third and fourth groups of memory cells is equal to or greater than four.

Again, there are many inventions, and aspects of the inventions, described and illustrated herein. This Summary of the Inventions is not exhaustive of the scope of the present inventions. Indeed, this Summary of the Inventions may not be reflective of or correlate to the inventions protected in this and/or in continuation/divisional applications hereof.

Moreover, this Summary of the Inventions is not intended to be limiting of the inventions or the claims (whether the currently presented claims or claims of a divisional/continuation application) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 2B is a three dimensional view of an exemplary prior art memory cell comprised of one electrically floating body transistor (PD-SOI NMOS);

FIG. 2C is a cross-sectional view of the memory cell of FIG. 2B, cross-sectioned along line C-C';

FIG. 2D is a plan view layout (not drawn to scale) of a portion of the memory cell array of FIG. 2A;

FIGS. 3A and 3B are exemplary schematic illustrations of the charge relationship, for a given data state, of a prior art memory cell comprised of an electrically floating body transistor (N-channel type transistor);

FIGS. 10A-10C are schematic block diagram illustrations of an exemplary devices in which the present inventions may be implemented wherein FIGS. 10A and 10C are logic devices (having logic circuitry and resident memory) and FIG. 10B is a memory device (including primarily one or more memory arrays), according to certain aspects of the present inventions;

FIGS. 11A-11C are schematic representations of exemplary memory cell array(s), including a plurality of memory cells (for example, electrically floating transistors) in conjunction with data sense circuitry, according to various embodiments of the present inventions;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to an architecture, a configuration and/or a layout of a semiconductor memory cell array having a plurality of memory cells, arranged in a plurality of rows and columns. The memory cell array includes a plurality of bit lines, wherein each bit line is coupled to circuitry to read data from or write data into memory cells associated with the bit line. The memory cell array of the present inventions further includes a plurality of bit line segments coupled to each bit line, wherein each bit line segment is selectively and responsively coupled to its associated bit line via an associated isolation circuit. Notably, the memory cell array may comprise a portion of an integrated circuit device, for example, a logic device (such as, a microcontroller or microprocessor) or a memory device (such as, a discrete memory). In one embodiment of this aspect of the present inventions, each memory cell includes at least one electrically floating body transistor.

In another aspect, the present inventions are directed to techniques to control, read from and/or write data into one or more memory cells of the memory cell array. In this regard, in one embodiment, an integrated circuit device may include circuitry to implement the control, read and/or write operations/techniques with respect to the memory cell array having a plurality of bit line segments responsively coupled to each of the bit lines via an associated isolation circuit. In one embodiment of the present inventions, each memory cell includes at least one electrically floating body transistor.

Figure 1:
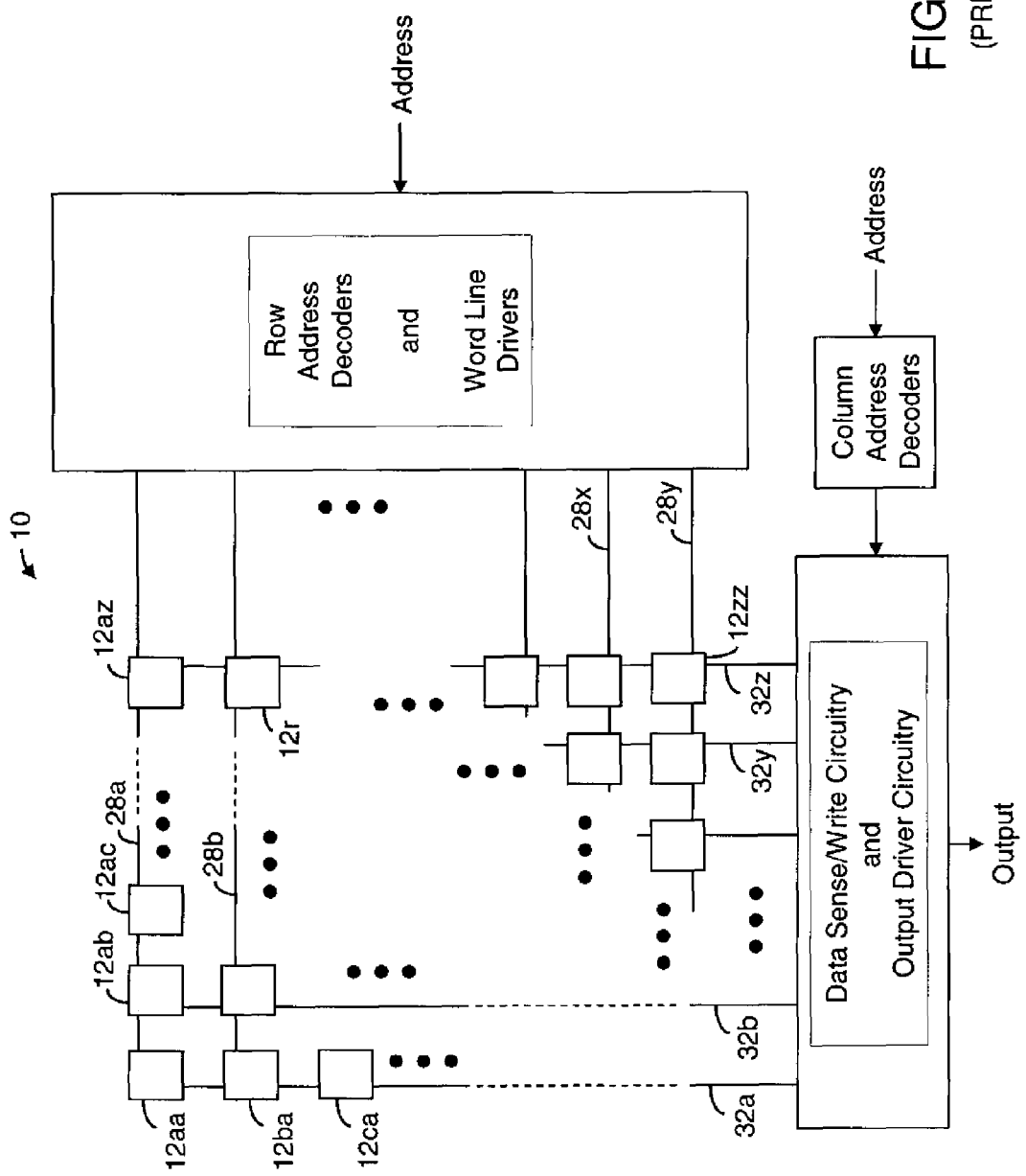
FIG. 1 is a schematic block diagram illustration of a conventional memory cell array having a plurality of memory cells arranged in an array of a plurality of rows and columns, in conjunction with row and column address decoders, word line drivers and data sense circuitry.
Figure 2A:
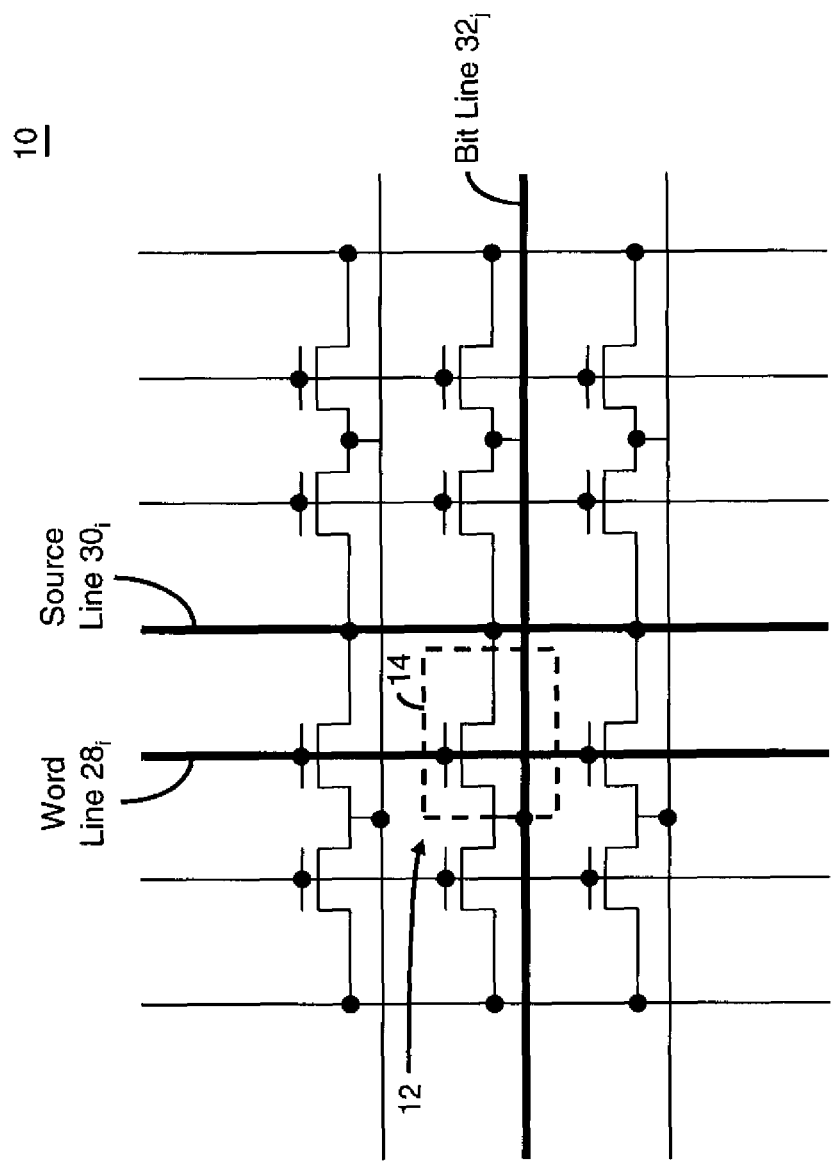
FIG. 2A is a schematic representation of a portion of a prior art memory cell array including a plurality of memory cells wherein each memory cell includes one electrically floating body transistor.
Figure 4A:
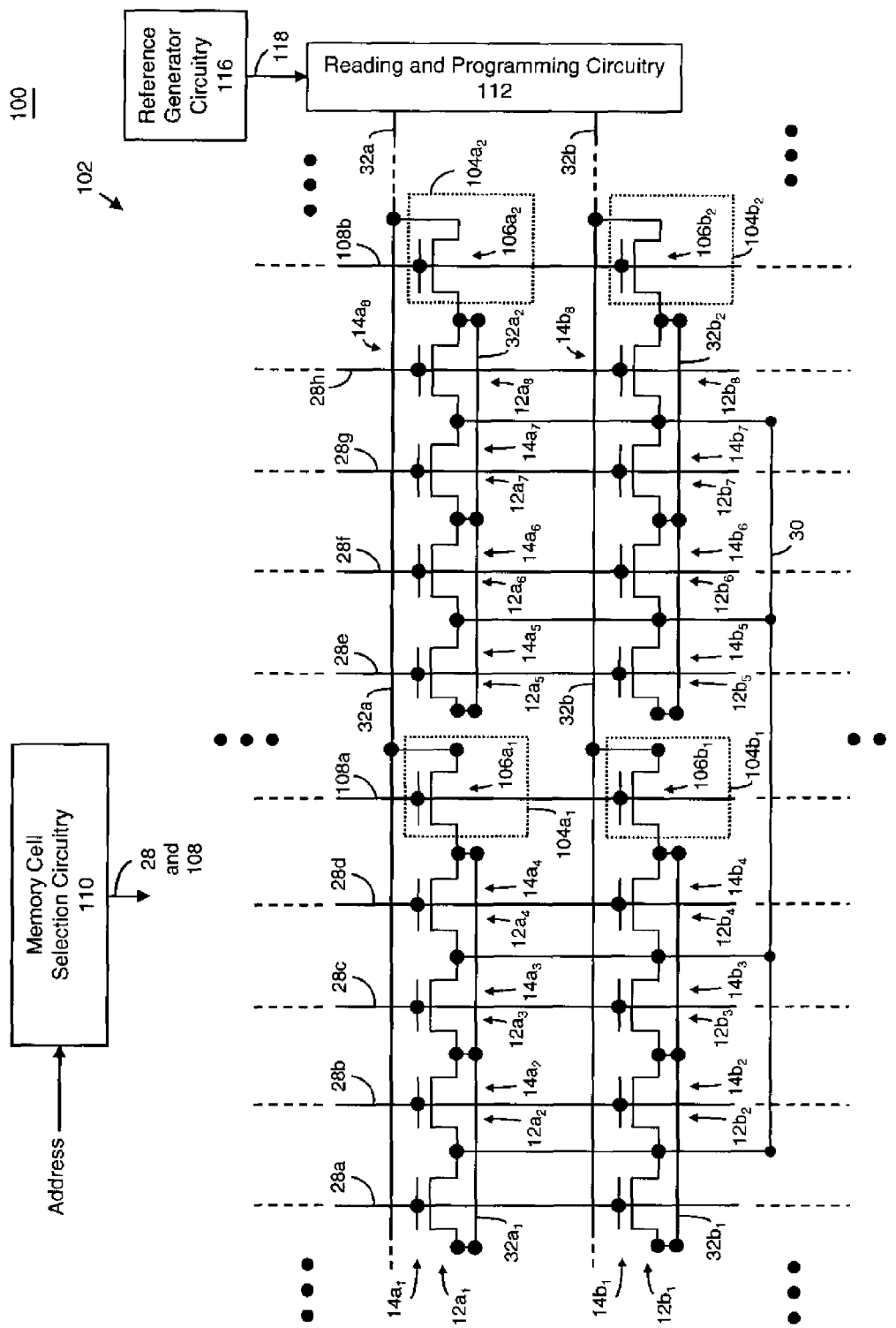
FIGS. 4A and 4B are schematic block diagram illustrations of a portion of an exemplary memory cell array including exemplary segmented bit line architectures in conjunction with isolation circuits, according to certain aspects of the present inventions, wherein each isolation circuit in this exemplary embodiment is an electrically floating body transistor (N-channel type transistors)

With reference to FIG. 4A, integrated circuit device 100, according to one embodiment of the present inventions, includes memory cell array 102 having a plurality of memory cells 12, each including electrically floating body transistor 14. Each memory cell 12 is connected to an associated word line 28 (via the gate of transistor 14) and an associated bit line 32 (via the drain of transistor 14). In this embodiment, a plurality of memory cells 12 are connected to an associated bit line segment 32x via an associated bit line segment 32$x_n$ and an associated isolation circuit 104$x_n$. For example, the drain regions of adjacent transistors 14$a_1$-14$a_4$ of adjacent memory cells 12$a_1$-12$a_4$, respectively, are connected to an associated bit line segment 32$a_1$. The bit line segment 32$a_1$ is connected to isolation circuit 104$a_1$ which responsively connects bit line segment 32$a_1$ to bit line 32a. Similarly, the drain regions of adjacent transistors 14$a_5$-14$a_8$ of adjacent memory cells 12$a_5$-12$a_8$, respectively, are connected to bit line 32a via bit line segment 32$a_2$ and isolation circuit 104$a_2$. Likewise, bit line segment 32$a_2$ is connected to isolation circuit 104$a_2$ which responsively connects bit line segment 32$a_2$ to bit line 32a.

Notably, the source regions of transistors 14 of memory cells 12 may be connected to a common signal line that may be routed parallel to word lines 28. A predetermined voltage (for example, a ground, common potential or decoded signal) may be applied to the common signal line.

In this exemplary embodiment, isolation circuit 104$x_n$ includes isolation transistor 106$x_4$ having a first region (for example, source region) connected to bit line segment 32$x_n$, and a second region (for example, drain region) connected to bit line 32x. As such, in this embodiment, an isolation enable signal is applied to the gate of isolation transistor 106$x_n$, via isolation select line 108$x_n$, to connect bit line segment 32$x_n$, to associated bit line 32x. In response to the isolation enable signal, the transistor 106$x_n$ connects bit line segment 32$x_n$ to associated bit line 32x. For example, in response to an isolation enable signal applied to isolation select line 108a, the source region of isolation transistor 106 connects bit line segment 32$a_1$ to bit line 32a.

Notably, in this exemplary embodiment, four adjacent memory cells 12 are connected to an associated bit line segment 32$x_n$. The present inventions may, however, be implemented with any number of memory cells 12, whether odd or even, connected to an associated bit line segment 32$x_n$. Indeed, any number of memory cells 12, whether odd or even, is intended to fall within the scope of the present inventions.

The integrated circuit device 100 further includes memory cell selection circuitry 110 and reading and programming circuitry 112. Briefly, memory cell selection circuitry 110 selects or enables one or more memory cells 12 to facilitate reading data therefrom and/or writing data thereto by applying a control signal, for example, on one or more word line 28 and isolation select lines 108. The memory cell selection circuitry 110 may generate such control signals using address data, for example, row address data. Indeed, memory cell selection circuitry 110 may include a conventional word line decoder and/or driver. There are many different control/selection techniques (and circuitry therefor) to implement the memory cell selection technique. Such techniques, and circuitry therefor, are well known to those skilled in the art. All memory cell control/selection techniques, and circuitry therefor, whether now known or later developed, are intended to fall within the scope of the present inventions.

Figure 13A:
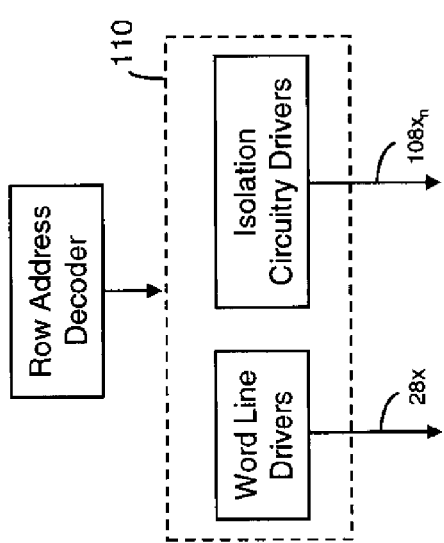
FIGS. 13A and 13B are exemplary schematic block diagram representations of memory cell selection circuitry, in conjunction with a row decoder, according to various embodiments of the present inventions.
Figure 13B:
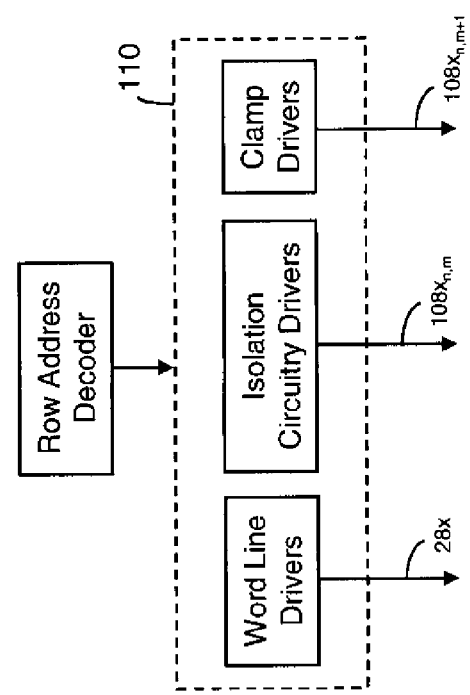
Figure 13C:
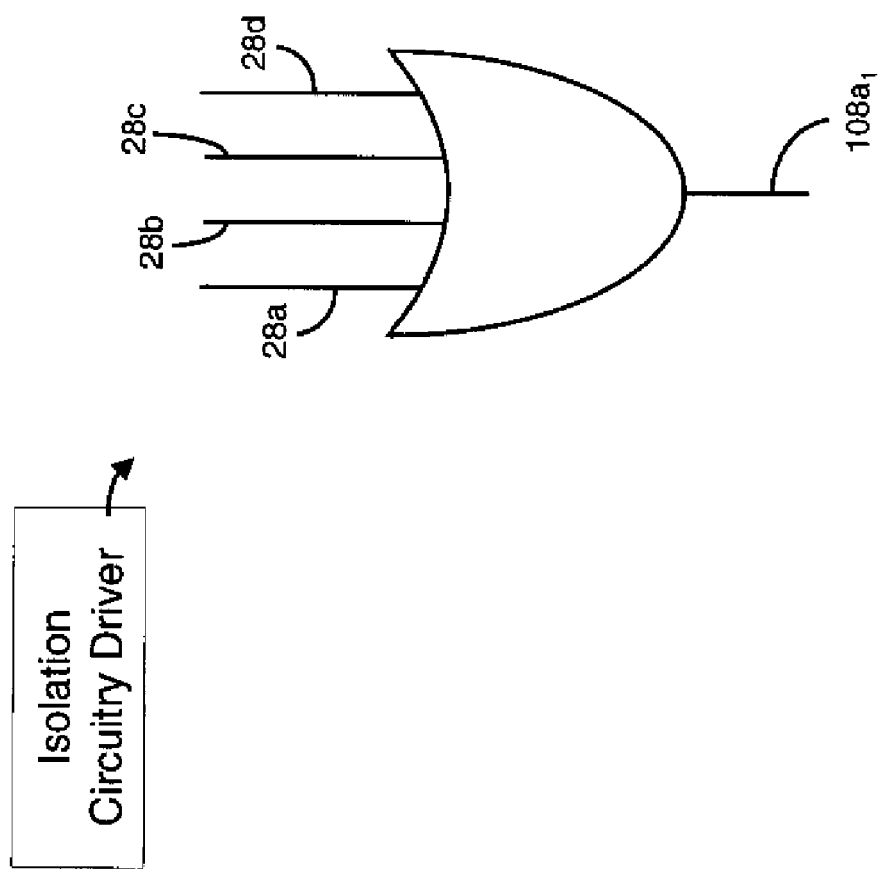
FIG. 13C is a schematic block diagram representation of isolation circuitry drivers, according to one exemplary embodiment of the present inventions.

Notably, memory cell selection circuitry 110 may generate the isolation enable signal(s) using the row addresses and appropriate addressing decoding architecture (which may be a subset of the pre-existing decoding architecture). In addition thereto, or in lieu thereof, memory cell selection circuitry 110 may employ the control signals applied on the associated word line 28 in conjunction with appropriate logic (for example, an n-input OR gate wherein the "n" inputs are connected to word lines 28 which are connected to memory cells 12 which are associated with bit line segment 32$x_n$; in this way, if any of the associated word lines 28 are enabled, the OR gate connected to receive those word lines 28 generates an active high for the associated isolation enable signal (See, for example, FIG. 13C)). Indeed, memory cell selection circuitry 110 may employ any control/selection techniques, and circuitry therefor, whether now known or later developed, to enable and/or control the isolation circuits 104; all such techniques and circuitry are intended to fall within the scope of the present inventions.

Alternatively, during "inactive" memory cycles, the "default" condition may include bit line segments $32x_n$ connected to their respective associated bit lines $32x$. Under these circumstances, during an active cycle, the decoded or selected bit line segment(s) may remain connected to the associated bit line and all unaddressed or unselected segments 32 may be isolated from the associated bit lines via associated isolation circuits 104. As such, in this embodiment, the bit line segments are connected to their respective associated until the associated isolation circuits are disabled (or enabled depending on the type of isolation circuit employed) thereby disconnecting unselected bit line segments form their associated bit line.

Figure 4B:
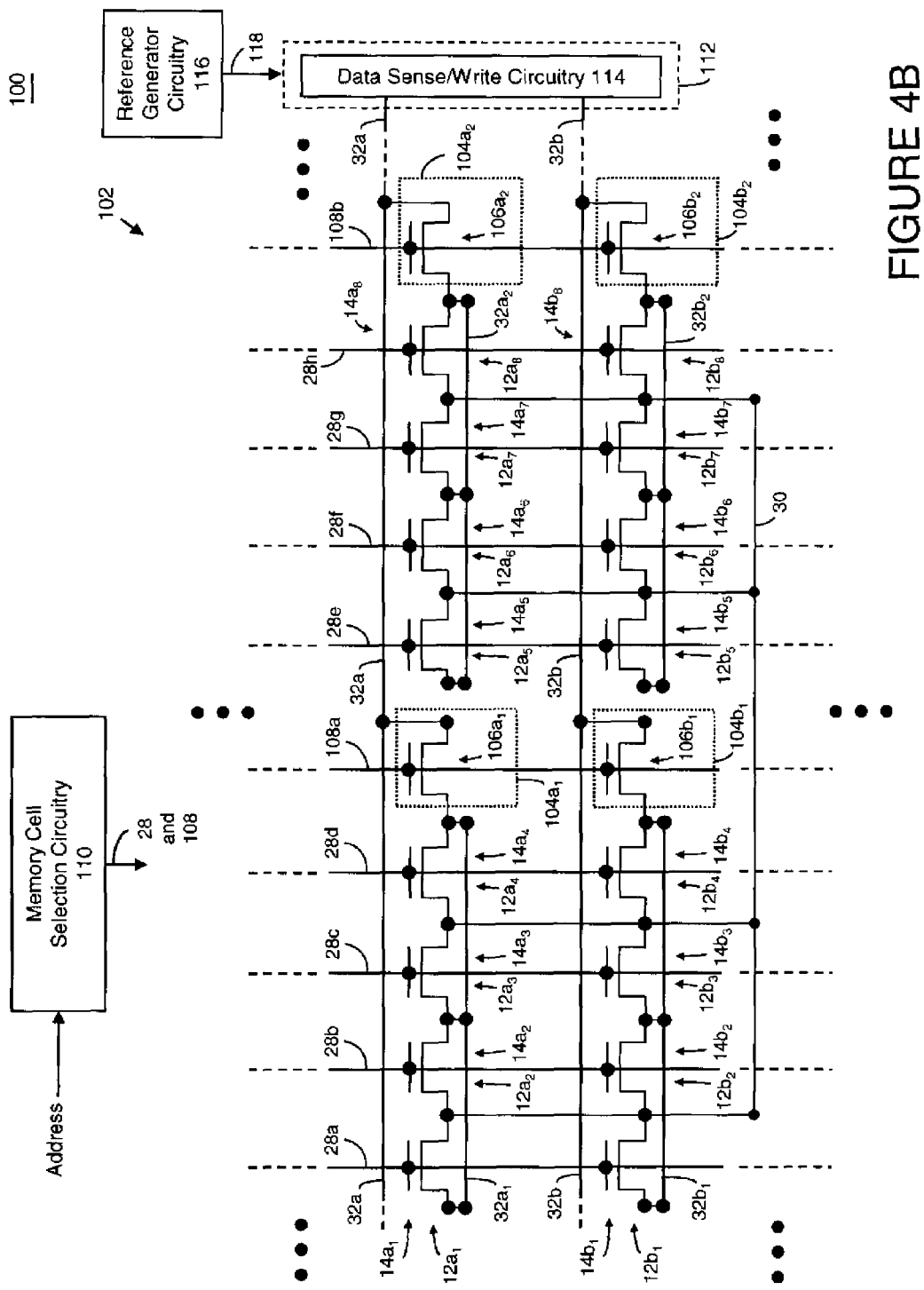

As mentioned above, reading and programming circuitry 112 reads data from and writes data to selected memory cells 12. With reference to FIG. 4B, in one embodiment, the reading and programming circuitry 112 includes a plurality of data sense/write circuitry 114 having data sense amplifiers. Each data sense/write circuitry 114 receives at least one bit line 32 and an output of reference generator circuitry 116 (for example, a current or voltage reference signal). In one embodiment, data sense/write circuitry 114*a-x* includes a data sense amplifier (for example, a cross-coupled sense amplifier as described and illustrated in the Non-Provisional U.S. patent application Ser. No. 11/299,590, filed by Waller and Carman, on Dec. 12, 2005, and entitled "Sense Amplifier Circuitry and Architecture to Write Data into and/or Read Data from Memory Cells" (U.S. Patent Application Publication No. US 2006 0126374), the application being incorporated herein by reference in its entirety) to sense the data state stored in memory cell 12 and/or write-back data into memory cell 12. The data sense amplifier may employ voltage and/or current sensing circuitry and/or techniques. In the context of current sensing, a current sense amplifier may compare the current from the selected memory cell to a reference current, for example, the current of one or more reference cells. From that comparison, the circuitry may be determined whether memory cell 12 contained a logic high (relatively more majority carries 34 contained within body region 18) or logic low data state (relatively less majority carries 28 contained within body region 18).

The present inventions may employ any type or form of data sense/write circuitry 114 to read the data stored in memory cells 12. For example, the data sense/write circuitry 114 may implement one or more sense amplifiers, using voltage or current sensing techniques, to sense the data state stored in memory cell 12.

Moreover, the present inventions may employ any architecture or layout and/or technique of sensing data from and/or writing data into memory cells 12. For example, reading and programming circuitry 112 may employ the architectures, circuitry and techniques described and illustrated in U.S. Non-Provisional patent application Ser. No. 11/787,718, filed by Popoff, on Apr. 17, 2007, and entitled "Semiconductor Memory Array Architecture, and Method of Controlling Same", the application being incorporated herein by reference in its entirety. Briefly, with reference to FIG. 4C, in one embodiment, reading and programming circuitry 112 includes data sense/write circuitry 114*a* coupled to bit lines 32*a* and 32*c*, and data sense/write circuitry 114*b* coupled to bit lines 32*b* and 32*d*. In a read or write operation, one of the bit lines (i.e., the active bit line) is selectively connected to the data sense and/or write circuitry in order to sense the data state in a memory cell 12 and/or write a data state into a memory cell 12 which is associated with the selected bit line. For example, during a read or write operation, one of the bit lines 32*a* and 32*c* is connected to the sense circuitry in data sense/write circuitry 114*a*. Similarly, one of the bit lines 32*b* and 32*d* is connected to the sense circuitry in data sense/write circuitry 114*b*.

In one embodiment, the active bit line is selected by memory cell selection circuitry 110 using, for example, one or more bits of the row address (for example, the MSB or LSB). Notably, the other bit line is disconnected from the sensing circuitry of data sense/write circuitry 114. Again, the architectures, circuitry and/or techniques described and illustrated in U.S. Non-Provisional patent application Ser. No. 11/787,718 are incorporated by reference herein.

Figure 4C:
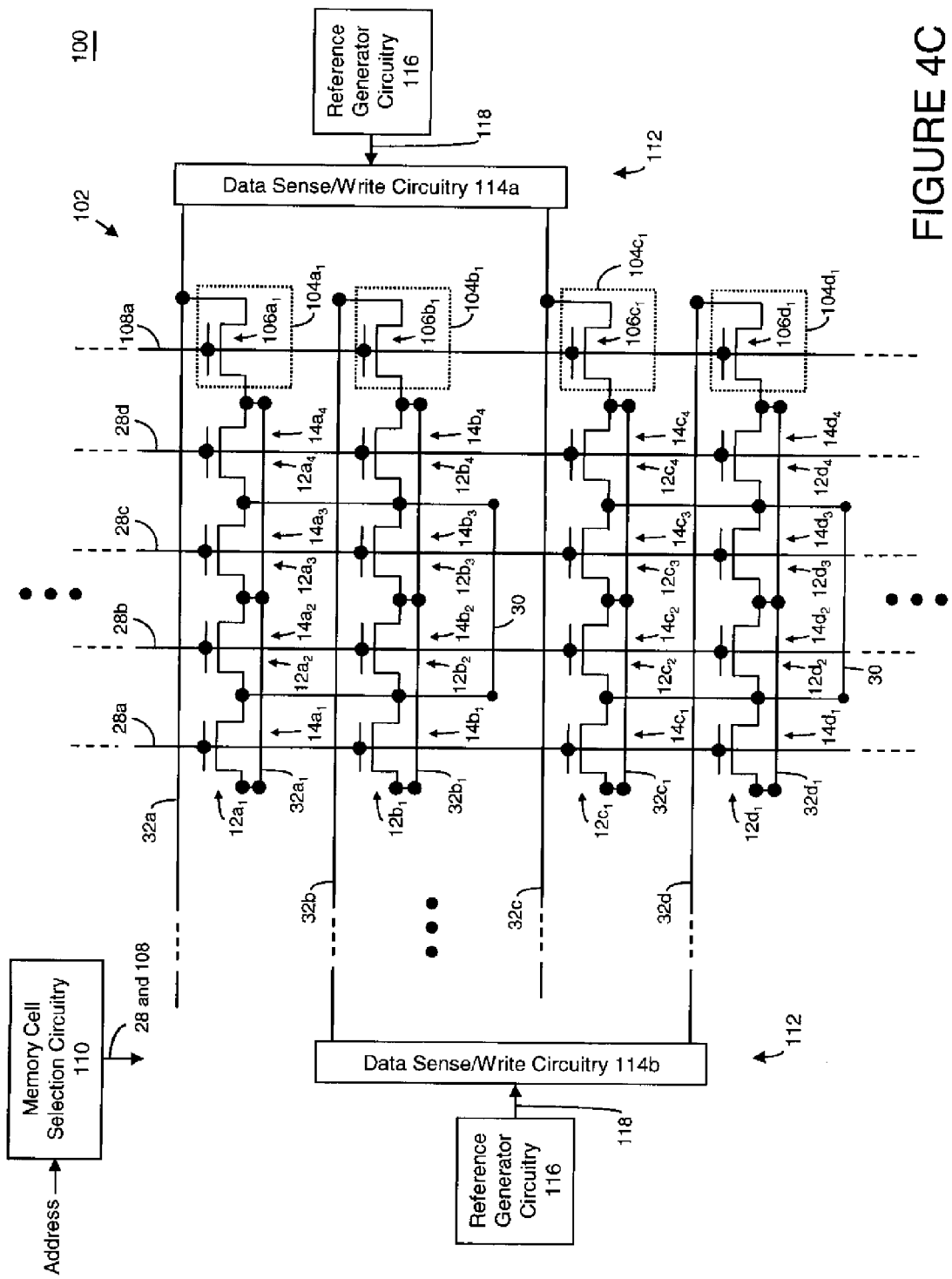
FIG. 4C is a schematic block diagram illustration of a portion of an exemplary memory cell array including an exemplary segmented bit line architecture in conjunction with isolation circuits and peripheral circuitry (i.e., reference generator circuitry and data sense/write circuitry), according to certain aspects of the present inventions, wherein the adjacent bit lines are connected to different data sense/write circuitry.
Figure 4D:
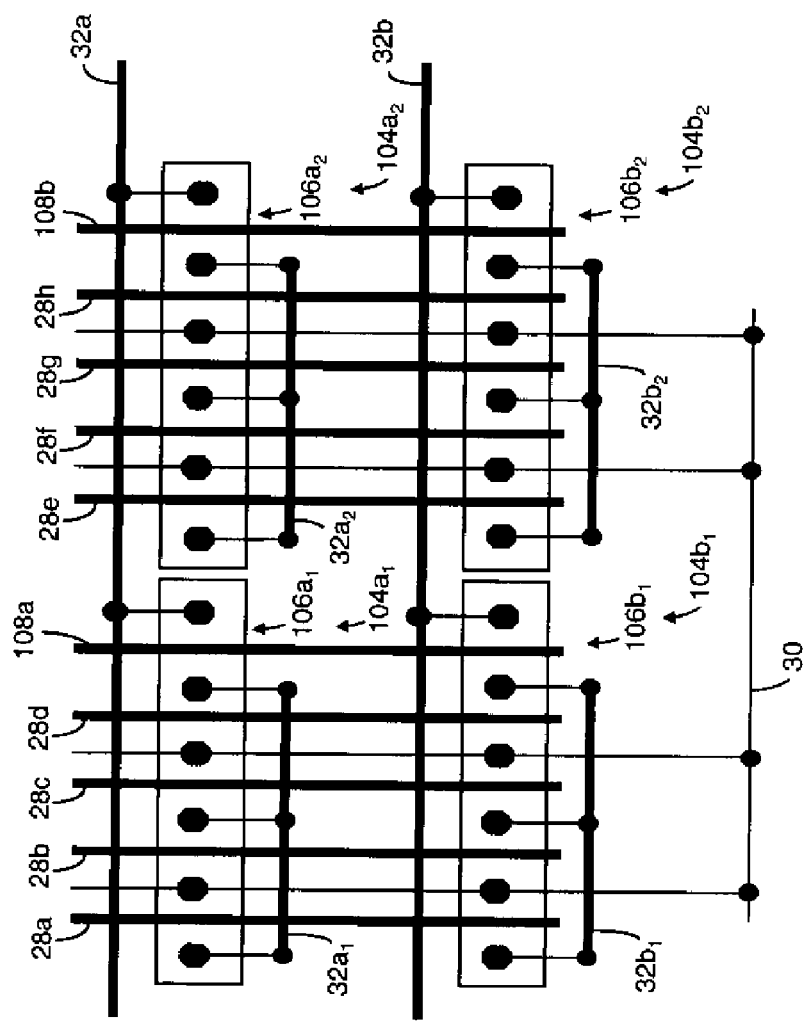
FIG. 4D is an exemplary plan view layout (not drawn to scale) of a portion of the memory cell array of FIGS. 4A and 4B illustrating the segmented bit line architecture and isolation circuit, according to certain aspects of the present inventions.

Notably, with reference to FIGS. 4A-4C, integrated circuit device 100 may also include reference generator circuitry 116. The reference generator circuitry 116 generates a reference signal (for example, a voltage and/or current reference signal) which is provided to reading and programming circuitry 112 via signal line 118. The reading and programming circuitry 112, and, in particular, data sense/write circuitry 108 employs the reference signal to determine the data state of the selected memory cell 12 during, for example, a read operation.

With continued reference to FIGS. 4A and 4B, in a read operation, memory cell selection circuitry 110, in response to an address signal designating memory cells 12 connected to, for example, word line 28*d*, applies a control signal on word line 28*d* and isolation select line 108*a*. In response, isolation circuit 104$a_1$ couples bit line segment 32$a_1$ to bit line 32*a*. In this way, the data sensing circuitry (for example, a cross-coupled sense amplifier) of reading and programming circuitry 112 may read the data state of memory cell 12$a_4$.

Similarly, isolation circuit 104$b_1$, in response to a isolation select signal applied on isolation select line 108*a*, couples bit line segment 32$b_1$ to bit line 32*b*. As such, the data state of memory cell 12$b_4$ may be read by the data sensing circuitry of reading and programming circuitry 112. As mentioned above, in one embodiment, during a read operation, the data sensing circuitry in reading and programming circuitry 112 compares a signal from the selected memory cells 12 (in this example, memory cells 12$a_4$ and 12$b_4$) to a reference signal from reference generator circuitry 116 to determine the data state stored in the selected memory cells 12.

Notably, during the exemplary read operation, isolation circuit 104$a_2$ and isolation circuit 104$b_2$ isolate memory cells 12 which are associated with or connected to bit line segments 32$a_2$ and 32$b_2$ (i.e., memory cells 12$a_5$-12$a_8$ and 12$b_5$-12$b_8$, respectively). That is, transistors 14 of memory cells 12 which are connected to the other bit line segments $32x_n$ associated with bit lines 32*a* and 32*b* are "isolated" during the read or write operations. Thus, when a drain voltage is passed through isolation transistor 106 associated with the selected memory cell 12 of the associated bit line segments $32x_n$, the voltage may adversely impact the other cells of that bit line segment; the other memory cells 12 in memory cell array 102 are isolated. Accordingly, such memory cells are less susceptible to voltage/current disturbance on bit line 32 during the read operation of memory cells 12 connected to other bit line segments $32x_n$ (in this example, bit line segments 32$a_1$ and 32$b_1$). Indeed, the present inventions may facilitate implementing significant burst read and write operations where the memory cells isolated from bit lines 32, via isolation circuit 104$x_n$, may be read in a burst read manner (for example, by sequentially addressing those word lines 28 which are associated with a given bit line segment 32).

In a write operation, in response to an address signal designating memory cells 12 connected to, for example, word line 28e, memory cell selection circuitry 110 applies a control signal on word line 28e and isolation select line 108b. In response, isolation circuit $104a_2$ couples bit line segment $32a_2$ to bit line 32a. Similarly, isolation circuit $104b_2$, in response to an isolation select signal applied on isolation select line 108b, couples bit line segment $32b_2$ to bit line 32b. In this way, the data writing circuitry of reading and programming circuitry 112 may write (or refresh) the data state of memory cells $12a_5$ and $12b_5$.

During the exemplary write operation, isolation circuits $106a_1$ and $106b_1$ isolate memory cells 12 which are connected to bit line segments $32a_1$ and $32b_1$ (i.e., memory cells $12a_1$-$12a_4$ and $12b_1$-$12b_4$, respectively). Accordingly, such memory cells are less susceptible to voltage/current disturbance on bit line 32 during the write operation of memory cells 12 connected to other bit line segments $32x_n$ (in this example, bit line segments $32a_2$ and $32b_2$). Moreover, as noted above in the context of a read operation, the present inventions may facilitate implementing significant burst write operations where the memory cells isolated from bit lines 32, via isolation circuit $104x_n$, may be written in a burst write manner (for example, by sequentially addressing those word lines 28 which are associated with a given bit line segment 32).

Figure 4E:
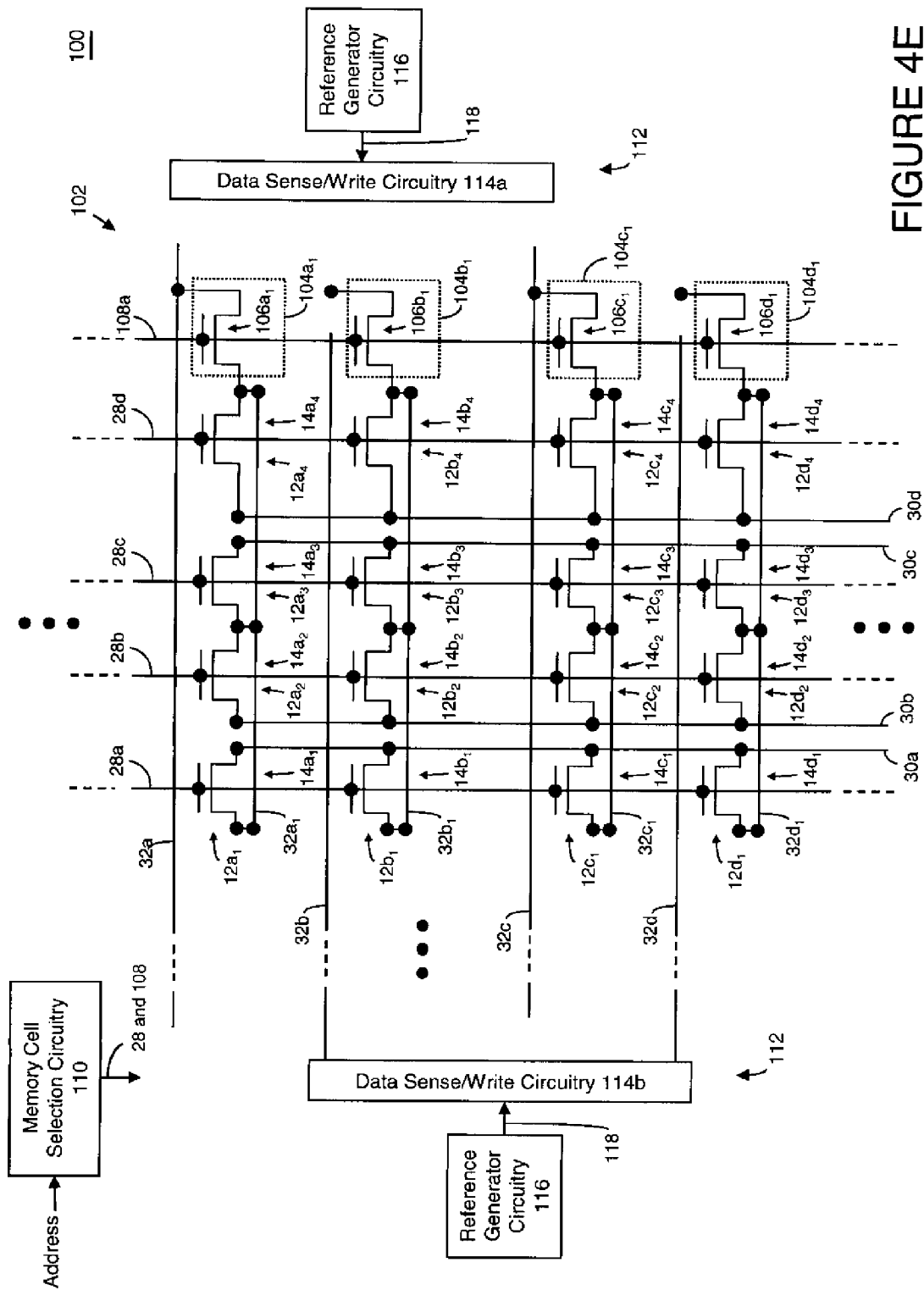
FIG. 4E is a schematic block diagram illustration of a portion of an exemplary memory cell array including exemplary segmented bit line architectures in conjunction with isolation circuits, according to certain aspects of the present inventions, wherein each isolation circuit in this exemplary embodiment is an electrically floating body transistor (N-channel type transistors)
Figure 4F:
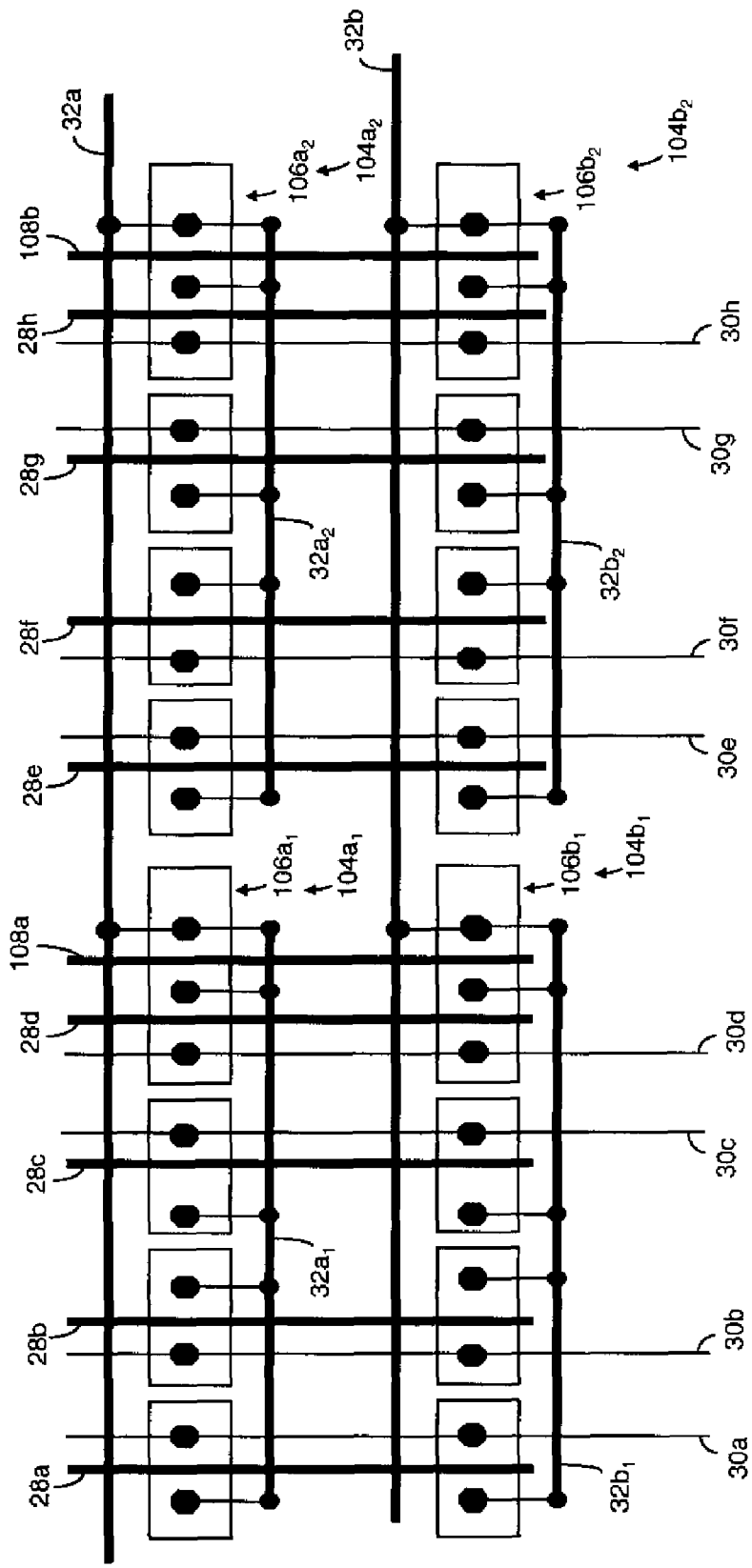
FIG. 4F is an exemplary plan view layout (not drawn to scale) of a portion of the memory cell array of FIG. 4E illustrating the segmented bit line architecture and isolation circuit, according to certain aspects of the present inventions.

Notably, the discussion above with respect to FIGS. 4A-4C is applicable to the embodiment illustrated in FIG. 4E wherein the source lines 32 are, among other things, routed parallel to word lines 28. For the sake of brevity, such discussions will not be repeated.

Figure 5A:
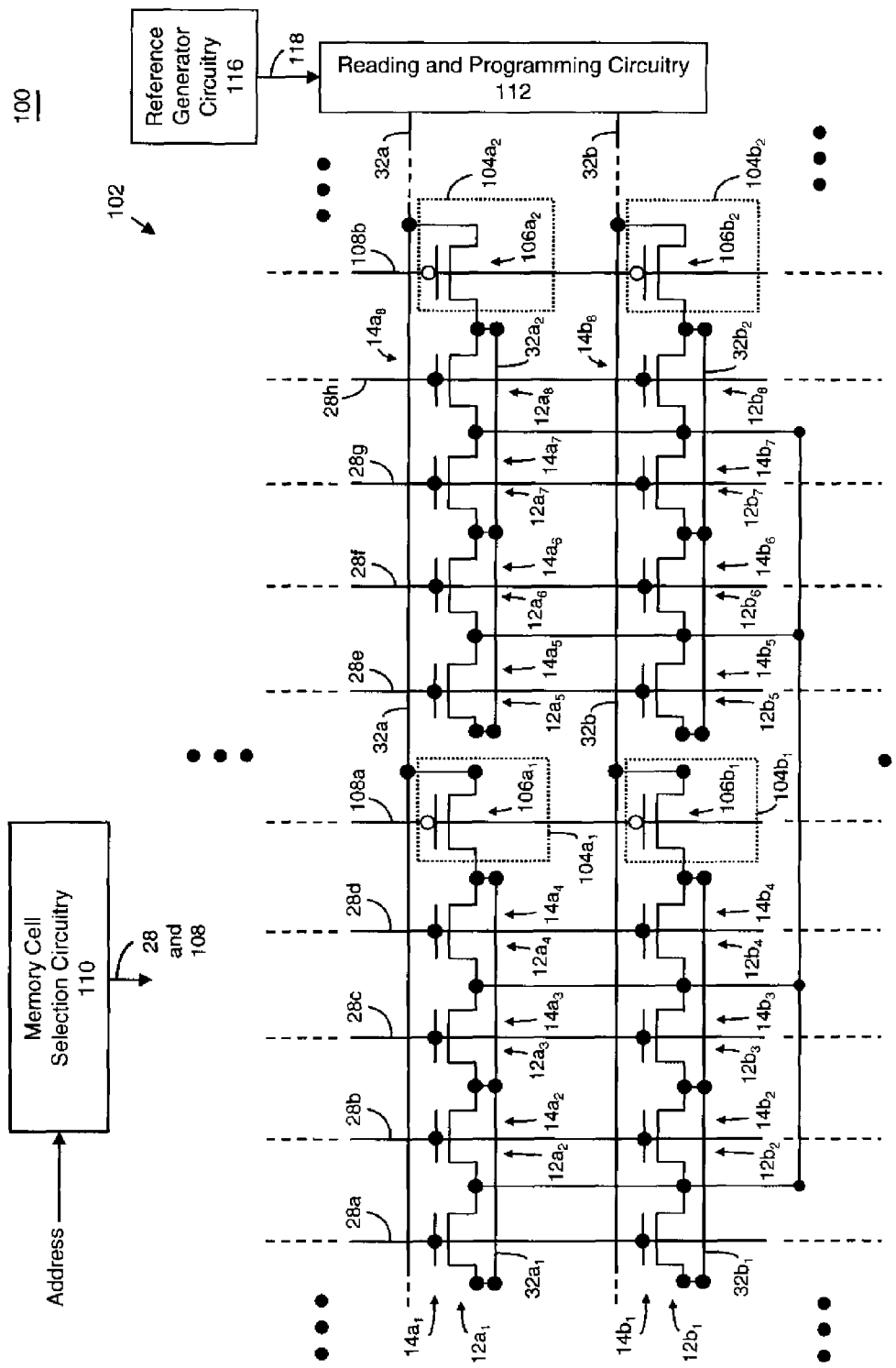
FIGS. 5A-5C are schematic block diagram illustrations of a portion of a exemplary memory cell array including an exemplary segmented bit line architecture in conjunction with isolation circuits, according to certain aspects of the present inventions, wherein each isolation circuit in this exemplary embodiment is a P-channel type electrically floating body transistor (FIGS. 5A and 5B) or an N-channel type electrically floating body transistor (FIG. 5C)

As discussed above, in one embodiment, the present inventions may include memory cells 12 having electrically floating body transistor 14, as described above. The memory cells 12 may include electrically floating body transistor 14 that are N-channel type transistor (see, FIGS. 4A-4C, 4E and 5A) or P-channel type transistors (see, FIGS. 5B and 5C). In addition, isolation circuit 104a, may include N-channel type transistor(s) (see, FIGS. 4A-4C and 4E) or P-channel type transistors (see, FIGS. 5A and 5B). Where isolation circuit 104 includes a P-channel type transistor(s), a more efficient positive voltage transfer may be obtained between (i) bit line segment $32x_n$ and its associated bit line 32 (during a read operation) and (ii) bit line 32 and its associated bit line segment $32x_n$ (during a write operation). Moreover, where isolation circuit 104 includes a N-channel type transistor(s) and the memory cells 12 include P-channel type transistor 14 (see, for example, FIG. 5C), a more efficient voltage transfer may be obtained between (i) bit line segment $32x_n$ and its associated bit line 32 (during a read operation) and (ii) bit line 32 and its associated bit line segment $32x_n$ (during a write operation). Notably, however, it may be advantageous to employ the same type of transistors for the memory cells and isolation circuit $104a_1$. In this way, a more compact design may be achieved, for example, where memory array 10 is formed in bulk material/substrate.

Figure 6A:
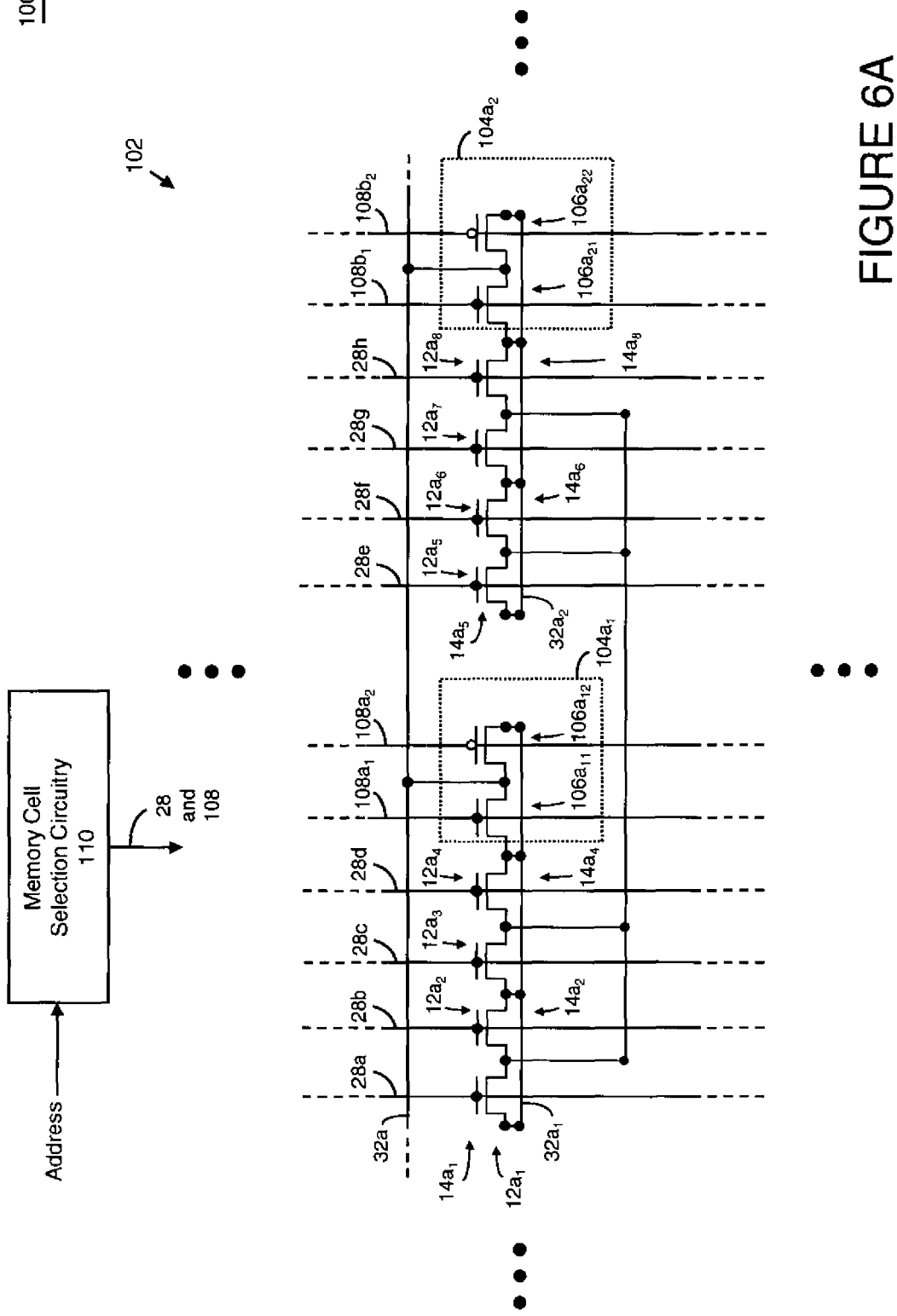
FIG. 6A is a schematic block diagram illustration of a portion of an exemplary memory cell array including an exemplary segmented bit line architecture in conjunction with isolation circuits, according to certain aspects of the present inventions, wherein each isolation circuit includes two isolation transistors arranged in a CMOS circuit or configuration.
Figure 6B:
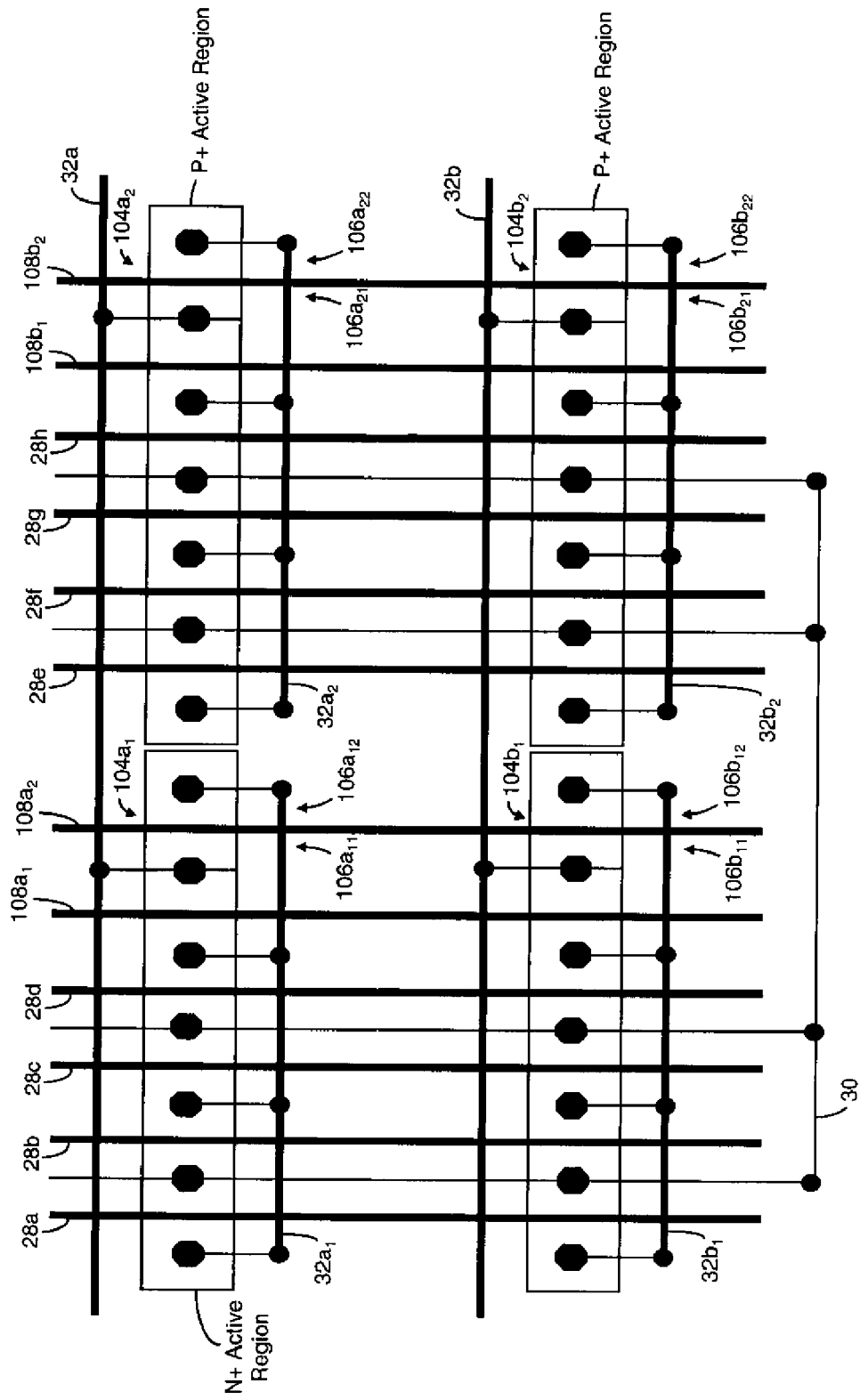
FIG. 6B is a plan view an exemplary layout (not drawn to scale) of a portion of the memory cell array of FIG. 6A illustrating the segmented bit line architecture and isolation circuit, according to certain aspects of the present inventions.

In another embodiment, isolation circuit 104 may include a plurality of transistors $106x_{nm}$ and $106x_{nm+1}$. For example, with reference to FIG. 6A, isolation circuit $104a_1$ includes isolation transistors $106a_{11}$ and $106a_{12}$ and isolation circuit $104a_2$ includes isolation transistors $106a_{21}$ and $106a_{22}$. In this embodiment, isolation transistors $106a_{11}$ and $106a_{12}$ and isolation transistors $106a_{21}$ and $106a_{22}$ each form a CMOS arrangement/circuit. As such, in operation, in response to an address signal designating memory cells $12a_1$ connected to, for example, word line 28a, memory cell selection circuitry 110 applies a control signal on word line 28a and isolation select line $108a_1$ and $108a_2$. In response, isolation circuit $104a_1$ couples bit line segment $32a_1$ to bit line 32a. The isolation circuit $104a_2$ is not enabled and, as such, maintains bit line segment $32a_2$ disconnected from bit line 32a. In this way, memory cells $12a_5$-$12b_8$ are isolated from bit line 32a during the read or write operations and, when a drain voltage is passed through isolation transistor $104a_{11}$ and $104a_{12}$, the voltage does not adversely impact the memory cells associated with the bit line segments associated with bit line 32a. Accordingly, such memory cells are less susceptible to voltage/current disturbance on bit line 32b during the read operation of memory cells $12a_1$. Indeed, as noted above, the present inventions may facilitate implementing significant burst read and write operations where the memory cells isolated from bit lines 32, via isolation circuit $104x_n$, may be read in a burst read manner.

Implementing a CMOS isolation circuit may enhance or improve the charge transfer from bit line $32x$ to an associated segmented bit line $32x_n$, (and/or vice versa). In addition to providing a more complete charge transfer from bit line 32 to the associated segmented bit line $32x_n$, employing a CMOS isolation circuit may also enhance the access times of the read and write operations. Notably, although there may be certain inefficiency in the size and layout of memory cell array 102, such inefficiency may be mitigated by increasing the number of memory cells 12 which are associated with a given bit line segment $32x_n$ and/or increasing the number of bit line segments $32x_n$ associated with each bit line 32.

Figure 7A:
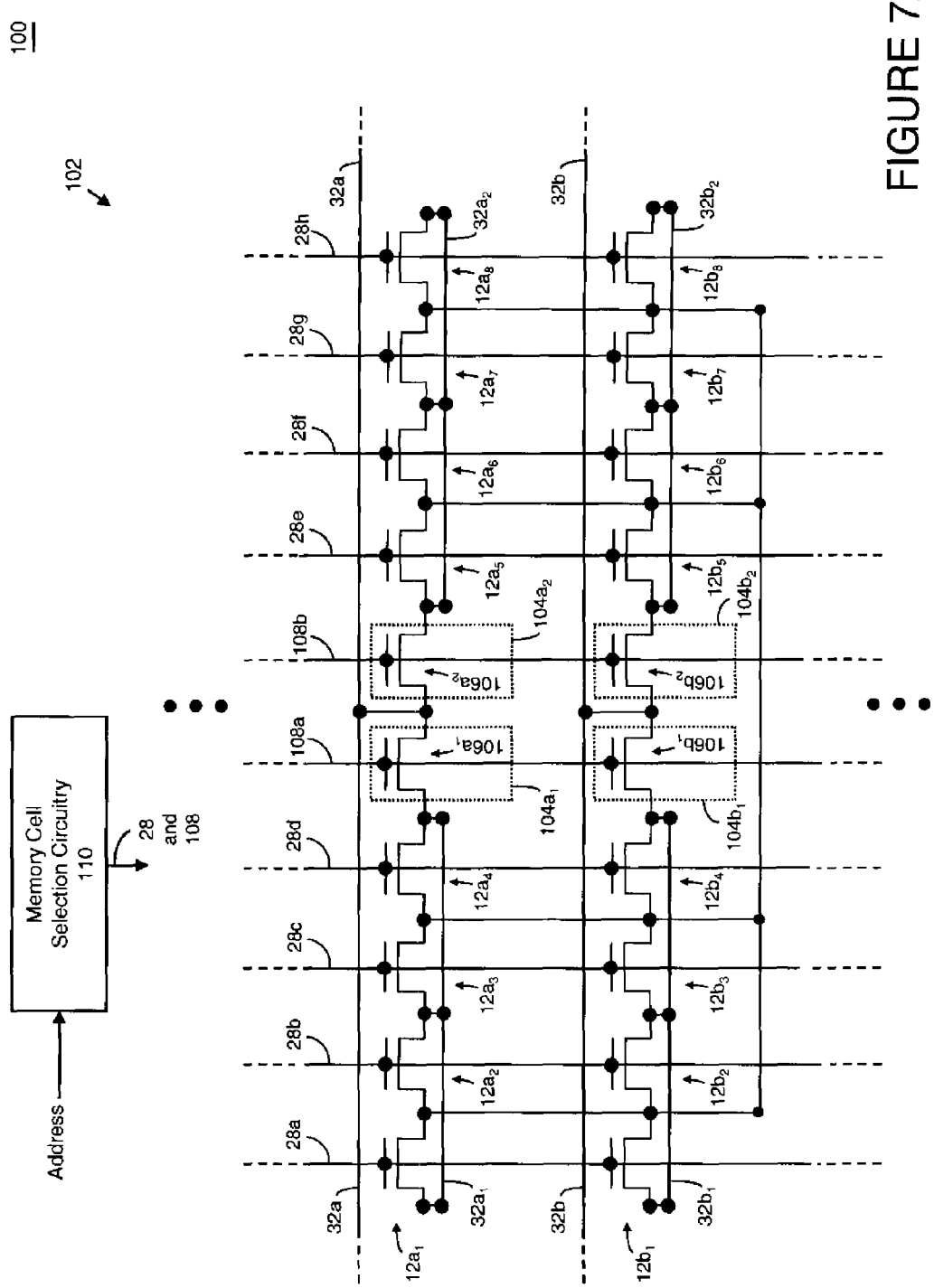
FIGS. 7A-7C are schematic block diagram illustrations of a portion of an exemplary memory cell array including an exemplary segmented bit line architecture in conjunction with isolation circuits and certain peripheral circuitry, according to certain aspects of the present inventions, wherein adjacent bit line segment-isolation circuit blocks are configured in a mirrored arrangement.
Figure 7B:
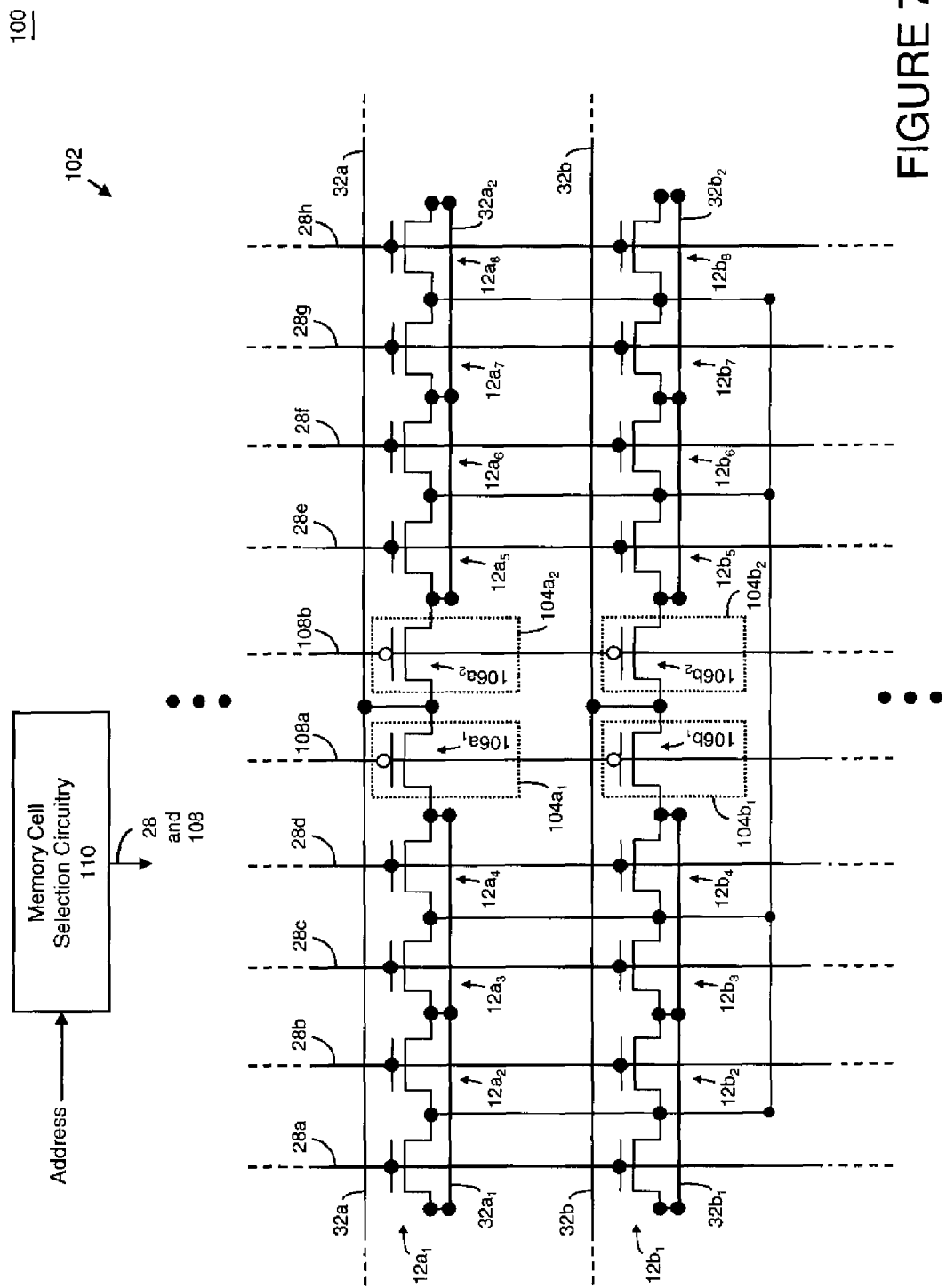

In another embodiment, isolation circuits 104 may be located adjacent each other, in a mirror layout, to improve array efficiency. In this regard, isolation transistors $106x_n$ of isolation circuits 104 may be juxtaposed so that the one or more regions of isolation transistors $106x_n$ are "shared" or are a common region. For example, with reference to FIGS. 7A and 7B, in one exemplary embodiment, isolation transistor $106a_1$ and isolation transistor $106a_2$ share a drain region which may reduce the area of the isolation circuits 104 and thereby improve the efficiency of memory cell array 102.

Figure 7C:
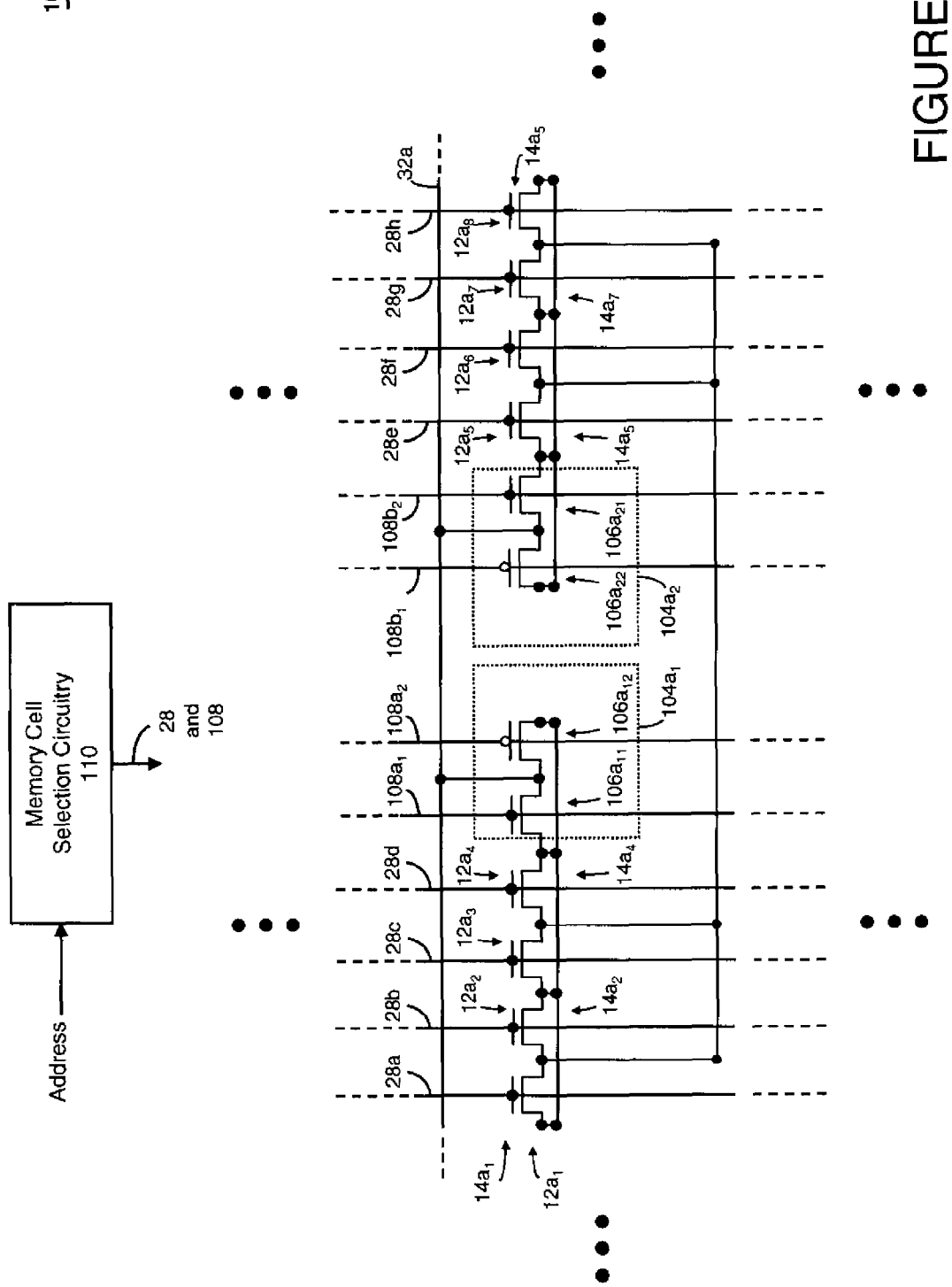

With reference to FIG. 7C, in another example, isolation circuits 104 having a CMOS architecture may also include a mirror layout, to improve array efficiency. In this regard, the PMOS or NMOS type isolation transistors $106x_n$ of adjacent isolation circuits 104 may be juxtaposed so that the one or more regions of isolation transistors $106x_n$ are "shared" or are a common region. In the illustrated embodiment, PMOS-type isolation transistor $106a_{12}$ and PMOS-type isolation transistor $106a_{22}$ may share a drain region. In this way, the area occupied by isolation circuits $104a_1$ and $104a_2$ may be reduced which may improve the efficiency of memory cell array 102.

Figure 8A:
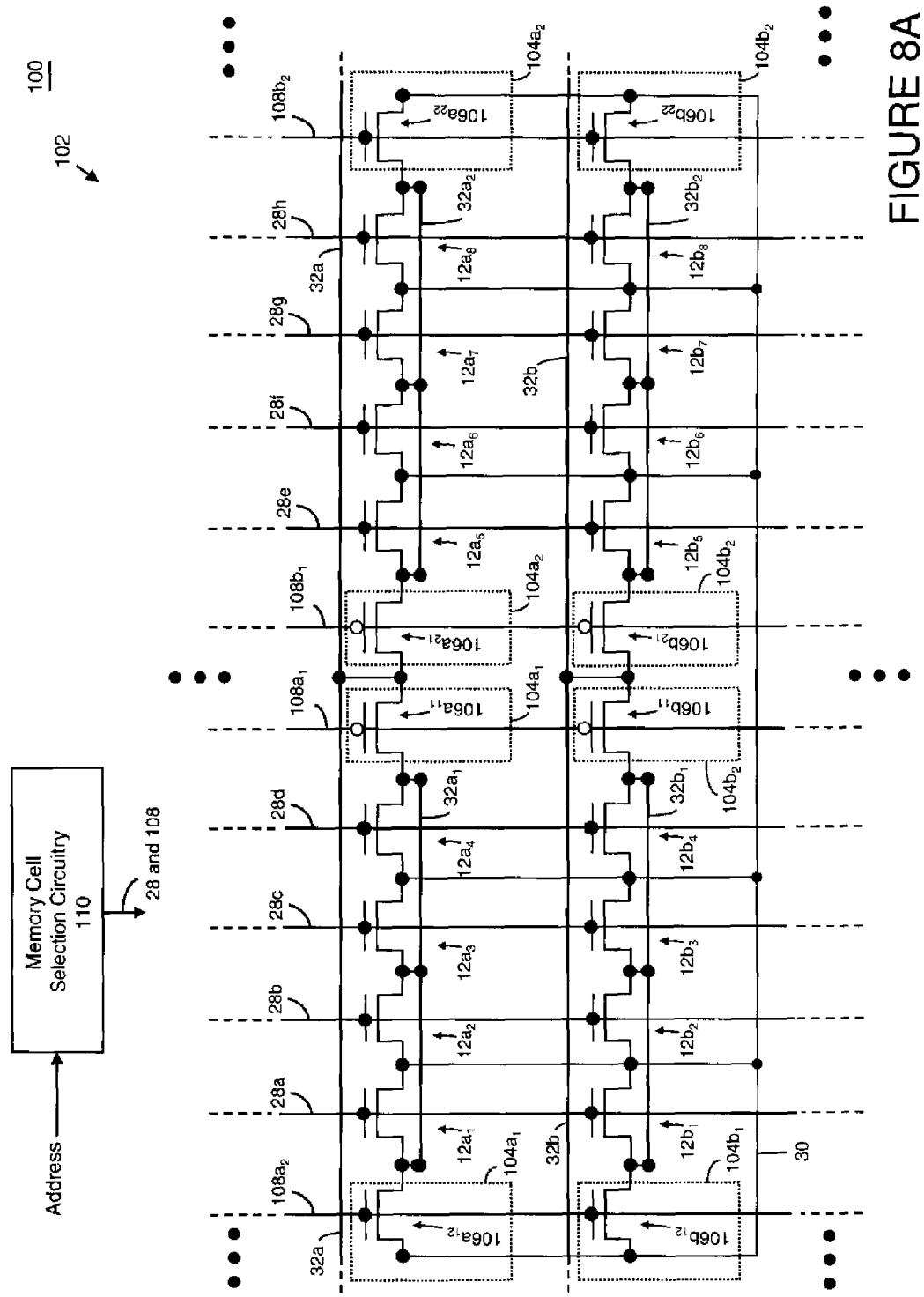
FIGS. 8A-8D are schematic block diagram illustrations of a portion of an exemplary memory cell array including a plurality of exemplary segmented bit line architectures in conjunction with isolation circuits, according to certain aspects of the present inventions, wherein each isolation circuit includes an isolation transistor and a clamp transistor.

In another embodiment, isolation circuits 104 include two or more transistors including an isolation transistor and a clamp transistor. With reference to FIG. 8A, in one embodiment, isolation circuit $104x$ includes isolation transistor $106x_{nm}$ and clamp transistor $106x_{nm+1}$. For example, isolation circuit $104a_1$ includes isolation transistor $106a_{11}$ and clamp transistor $106a_{12}$. In this embodiment, isolation transistor $106x_{nm}$ (for example, isolation transistor $106a_{11}$) selectively and responsively connects/isolates associated bit line segment $32x_n$ (for example, bit line segment $32a_1$) to the associated bit line $32x$ (for example, bit line 32a). The clamp transistor $106x_{nm+1}$ is employed to hold or maintain associated bit line segment $32x_n$ at a predetermined voltage. In this illustrative embodiment, the predetermined voltage may be a fixed voltage, such as, for example, ground, common or 0 Volts. In this way, the voltage on bit line segment $32x_n$ is not "floating" but may be maintained at a predetermined and/or fixed voltage.

With continued reference to FIG. 8A, in operation, in response to an address signal designating memory cells $12a_1$ connected to, for example, word line 28a, memory cell selection circuitry 110 applies a control signal on word line 28a and isolation select line $108a_1$ and clamp transistor line $108a_2$. In response, isolation transistor $106a_{11}$ is enabled to couple bit line segment $32a_1$ to bit line 32a and clamp transistor $106a_{12}$ is disabled to release bit line segment $32a_1$ from the predetermined and/or fixed voltage. The isolation circuit $104a_2$ is not enabled and, as such, maintains bit line segment $32a_2$ disconnected from bit line 32a and maintained at a predetermined and/or fixed voltage. In this regard, isolation transistor $106a_{21}$ is disabled which de-couples bit line segment $32a_2$ from bit line 32a and clamp transistor $106a_{22}$ is enabled which holds bit line segment $32a_2$ at a predetermined and/or fixed voltage. In this way, memory cells $12a_5$-$12b_8$ are isolated from bit line 32a during the read or write operations and the drain regions of transistors $14a_5$-$14b_8$ are maintained at a predetermined and/or fixed voltage. Accordingly, such memory cells are less susceptible to voltage/current disturbance on bit line 32b during the read operation of memory cells $12a_1$ and the drain regions of transistors $14a_5$-$14b_8$ do not electrically "float".

Thus, in operation, when bit line segment $32a_2$ is isolated from bit line 32a, any leakage currents that may tend to "charge-up" the bit line segment $32a_2$ are addressed and/or controlled by enabling clamp transistor $106a_{22}$, which maintains bit line segment $32a_2$ at a predetermined and/or fixed voltage. Although this may not present a disturb due to the limited power available, it may be advantageous to eliminate any "charging" of bit line segment $32a_x$ via the clamp transistor. Notably, the embodiment of FIG. 8A also completes the discharge of bit line segment $32a_x$ where a PMOS-type transistor is employed as the isolation transistor 106a.

Figure 5B:
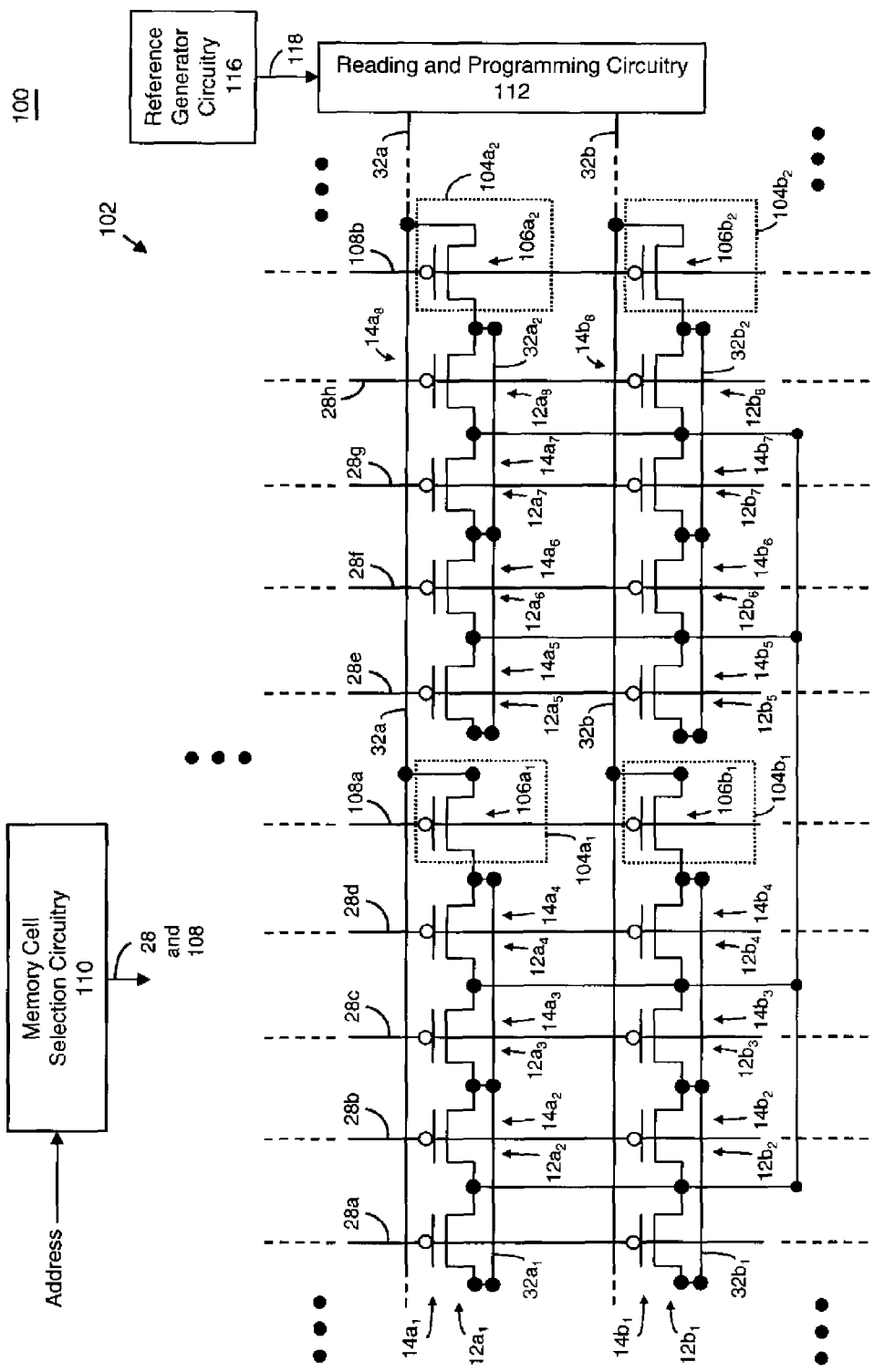
Figure 5C:
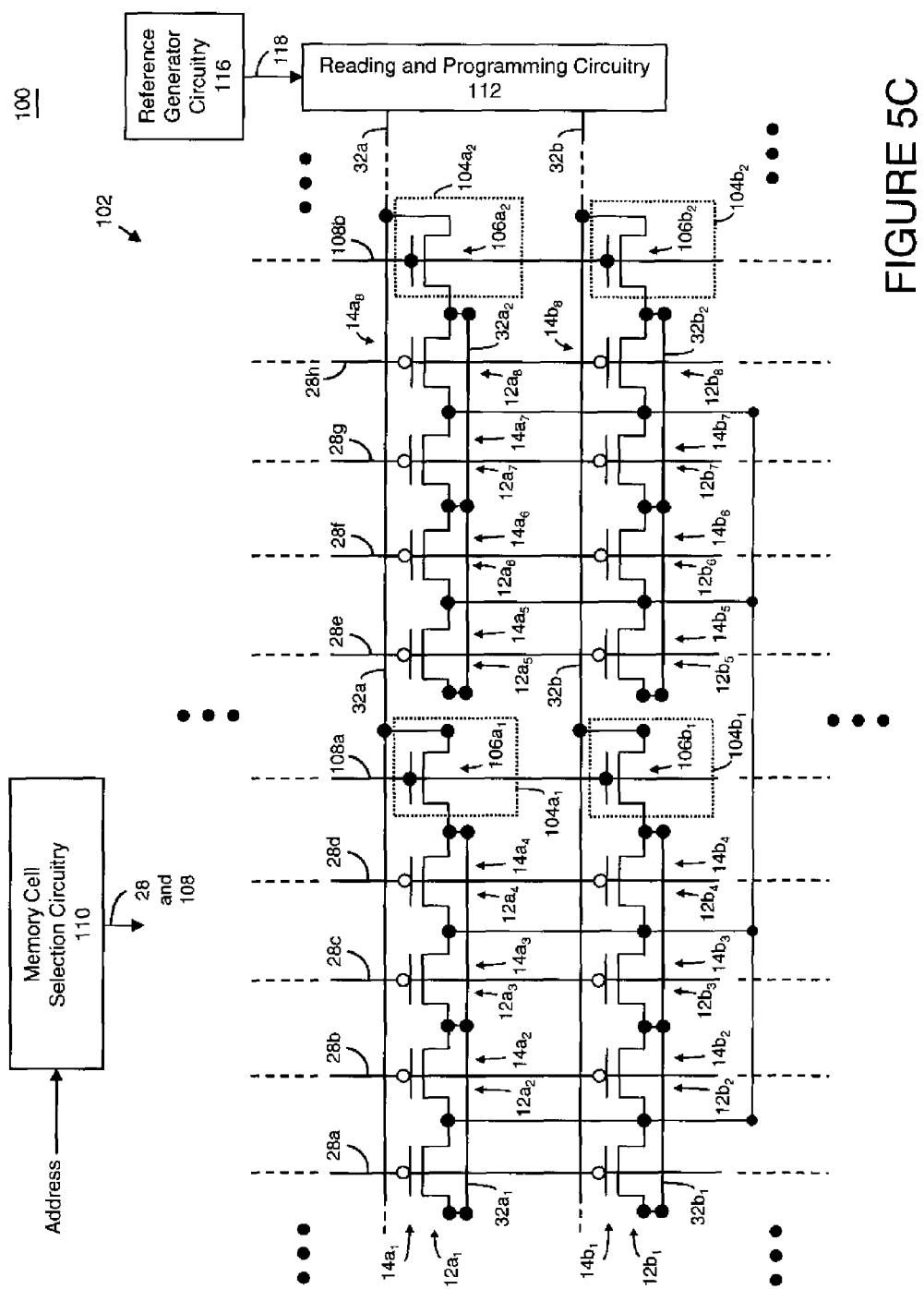
Figure 5D:
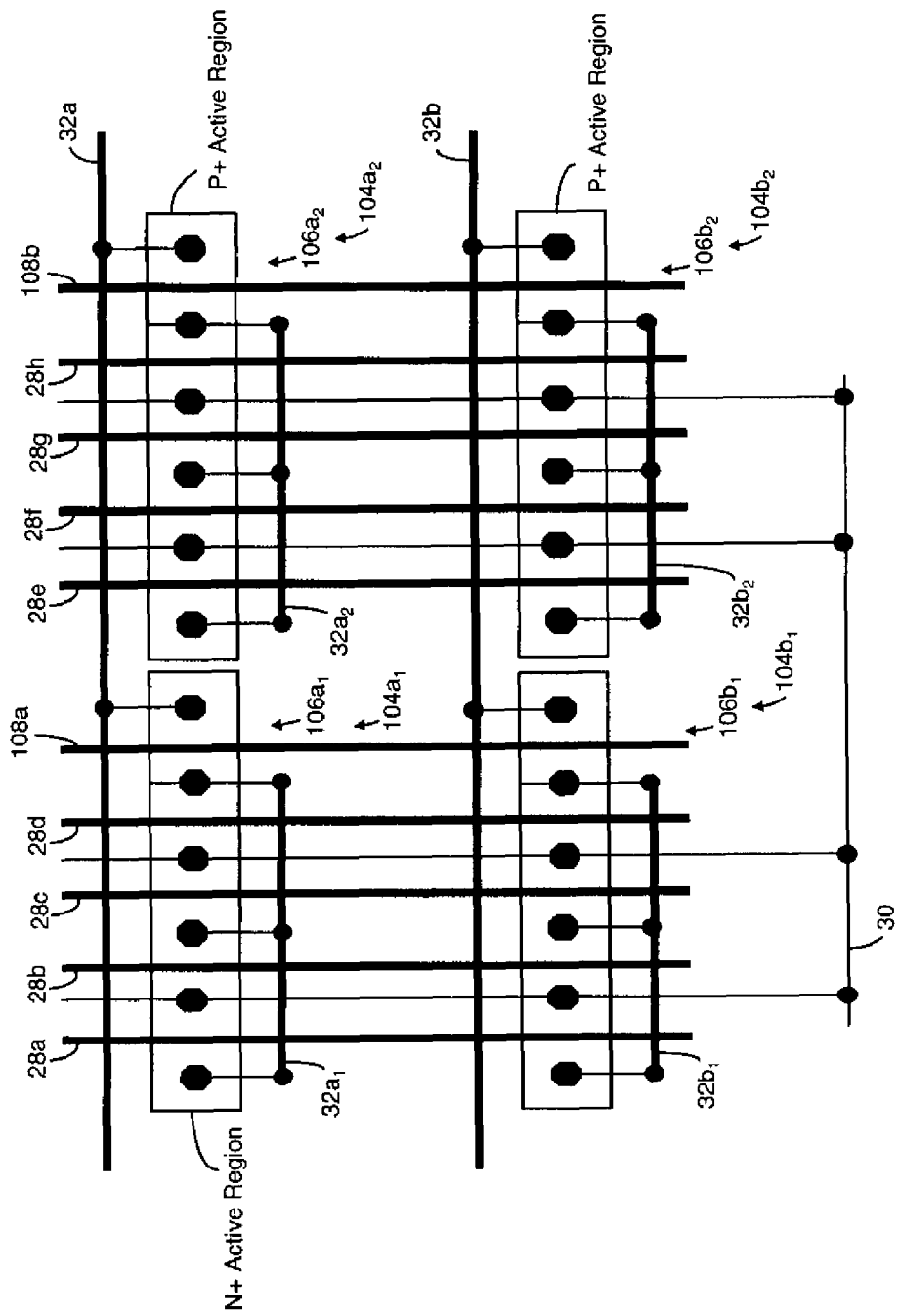
FIG. 5D is a plan view an exemplary layout (not drawn to scale) of a portion of the memory cell array of FIG. 5A illustrating the segmented bit line architecture and isolation circuit, according to certain aspects of the present inventions.
Figure 8B:
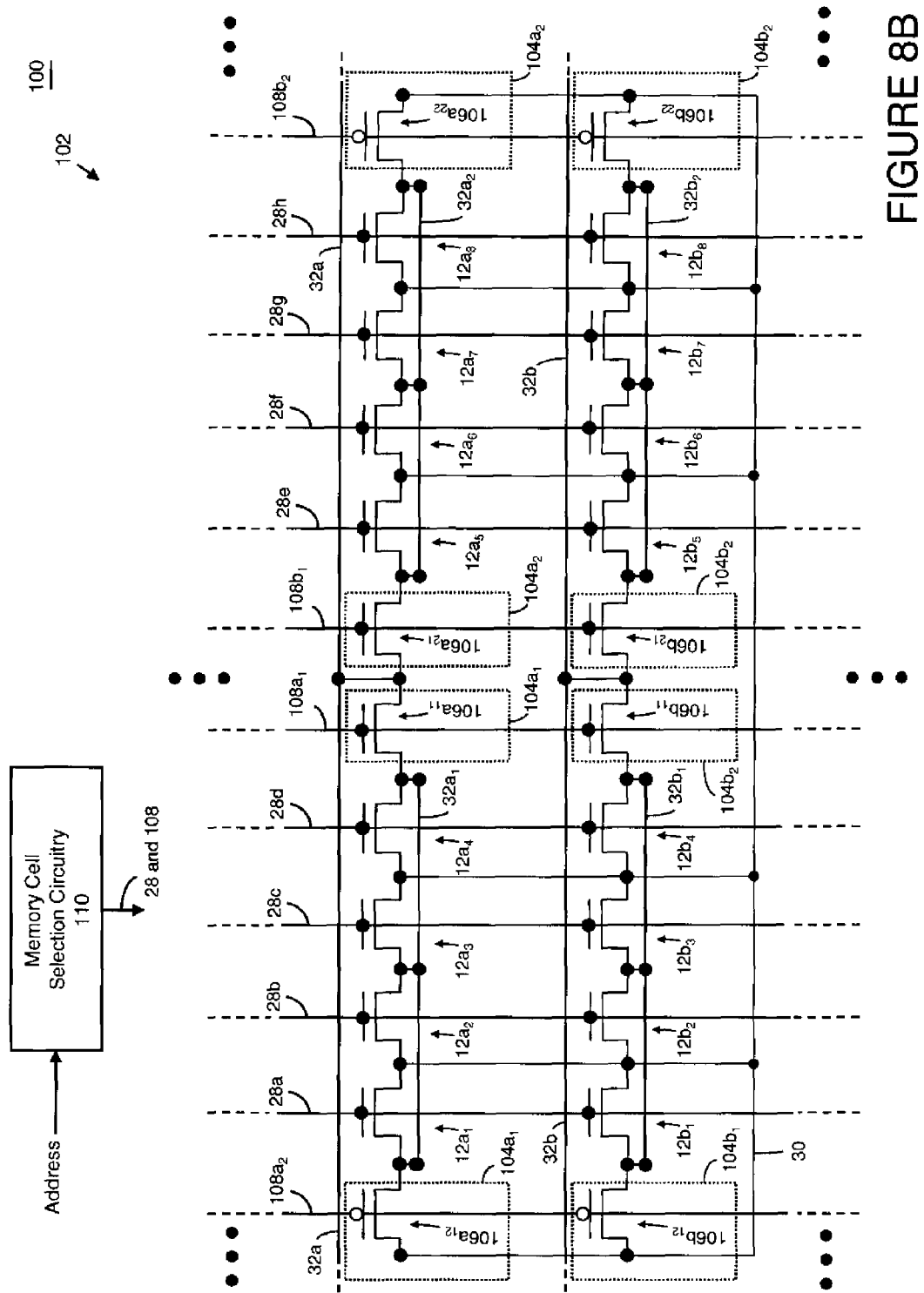
Figure 8C:
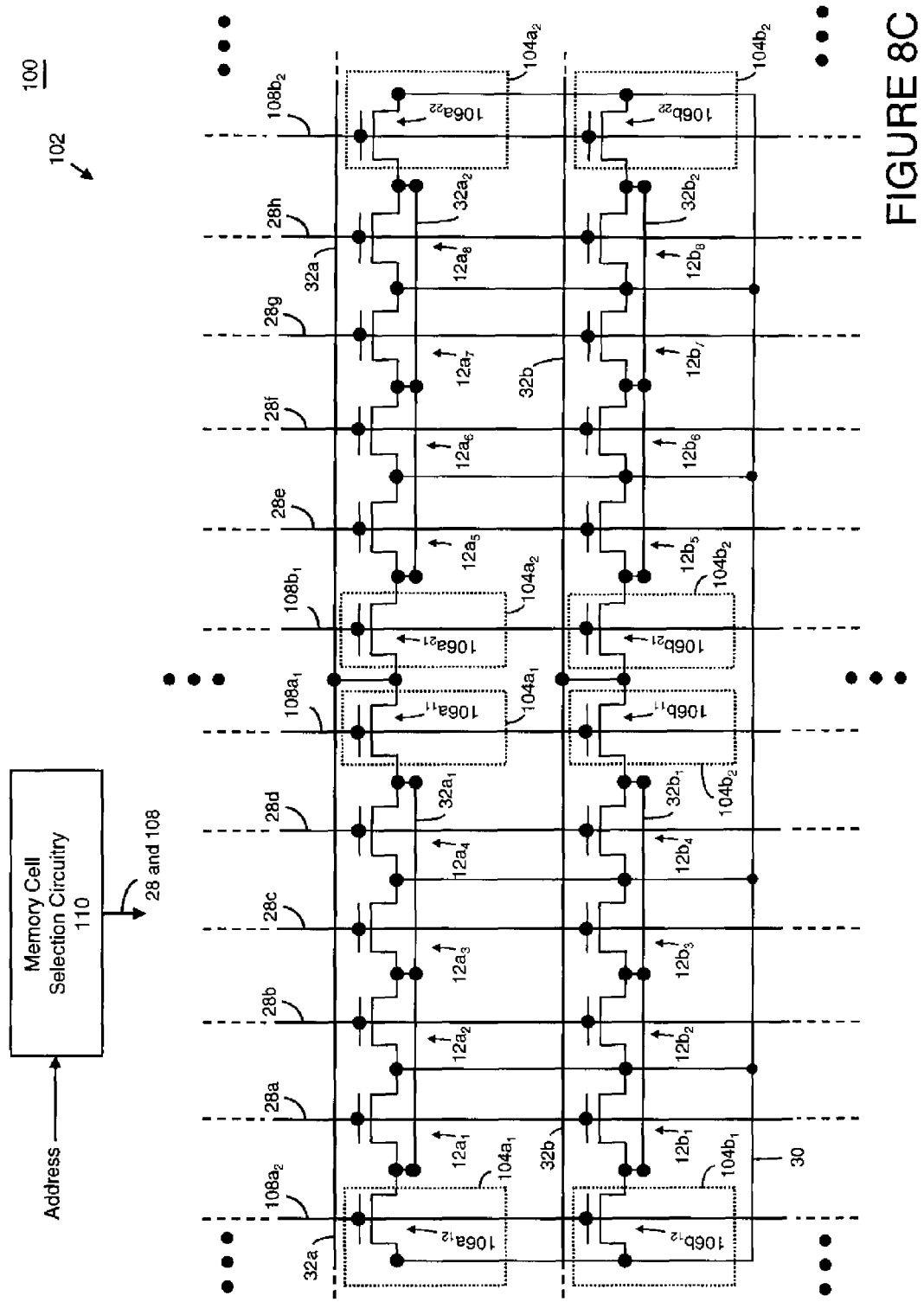
Figure 8D:
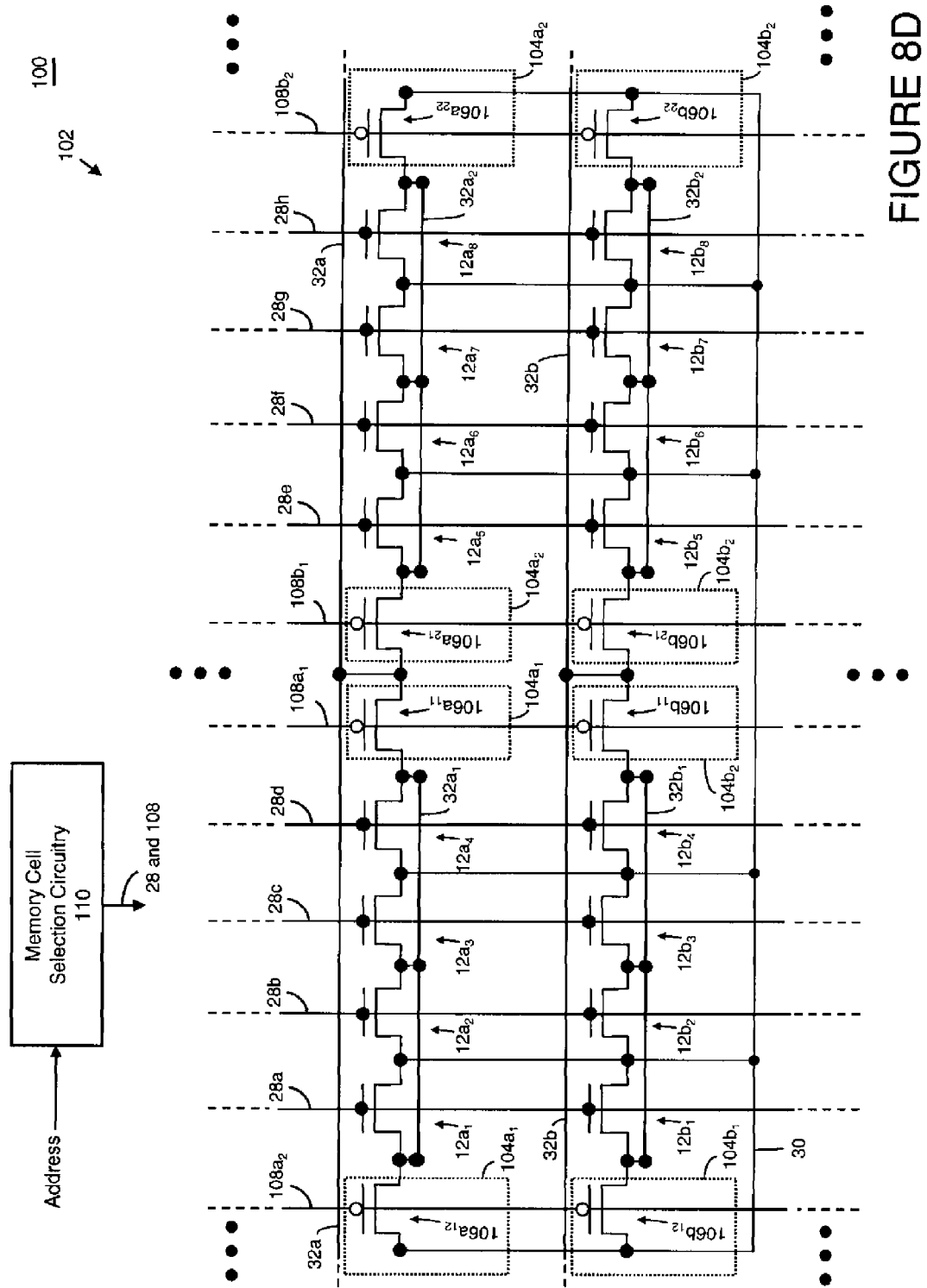
Figure 8E:
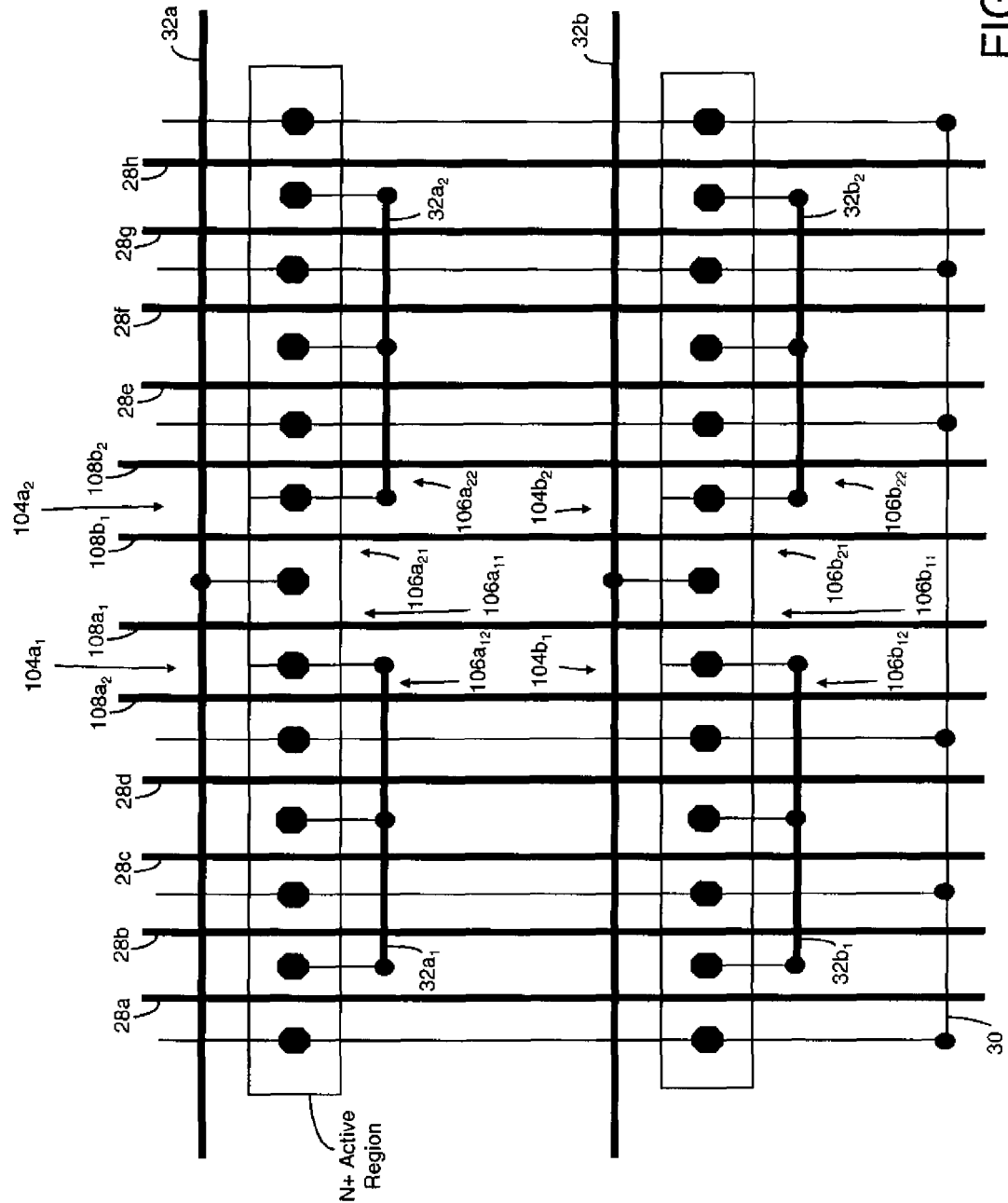
FIG. 8E is a plan view an exemplary layout (not drawn to scale) of a portion of the memory cell array of FIG. 8A illustrating the segmented bit line architecture and isolation circuit, according to certain aspects of the present inventions.

As noted above, in one embodiment, the present inventions may implement memory cells 12 including N-channel type transistor (see, FIGS. 5A and 6A) or P-channel type transistors (see, FIGS. 5B and 5C). In addition, isolation transistor $106x_{nm}$ may be N-channel type transistor(s) (see, FIGS. 8B and 8C) or P-channel type transistors (see, FIGS. 8A and 8D). Moreover, clamp transistors $106x_{nm+1}$ may be N-channel type transistor(s) (see, FIGS. 8A and 8C) or P-channel type transistors (see, FIGS. 8B and 8D). All permutations and combinations are intended to fall within the scope of the present inventions.

It may be advantageous to incorporate or provide a timing relationship between the enablement of isolation transistor $106x_{nm}$ and the disablement of the associated clamp transistor $106x_{nm+1}$ from the predetermined and/or fixed voltage. In this regard, in one embodiment, isolation transistor $106x_{nm}$ may be enabled coincident (or substantially coincident) with disabling the associated clamp transistor $106x_{nm+1}$. In another embodiment, it may be advantageous to disable the clamp transistor $106x_{nm+1}$ prior to enabling the associated isolation transistor $106x_{nm}$. In yet another embodiment, it may be advantageous to enable isolation transistor $106x_{nm}$ prior to enabling the associated clamp transistor $106x_{nm+1}$.

Figure 9A:
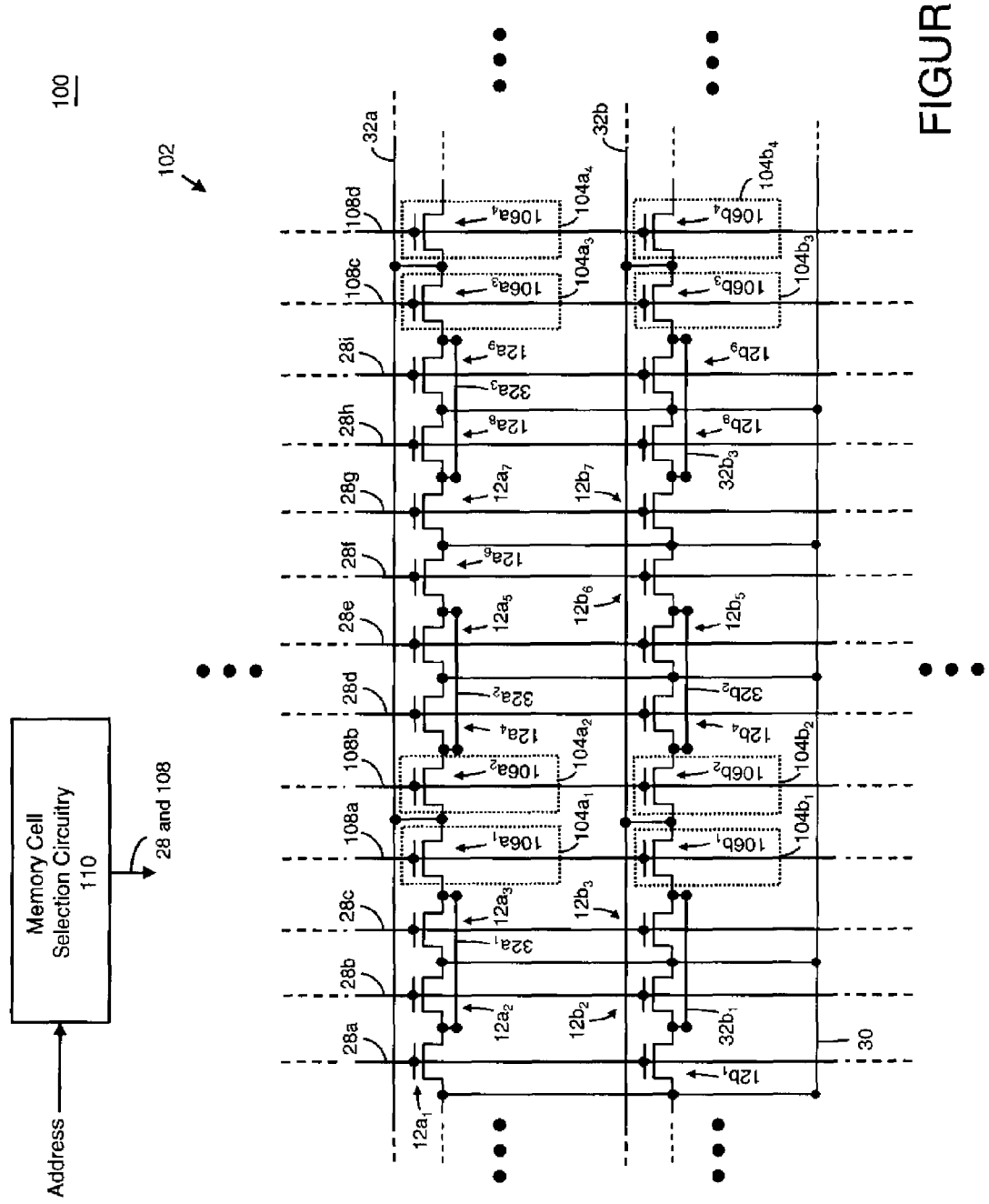
FIGS. 9A and 9B are schematic block diagram illustrations of a portion of an exemplary memory cell array including exemplary segmented bit line architectures in conjunction with isolation circuits, according to certain aspects of the present inventions, wherein each bit line segment includes an odd number of memory cells connected thereto.
Figure 9B:
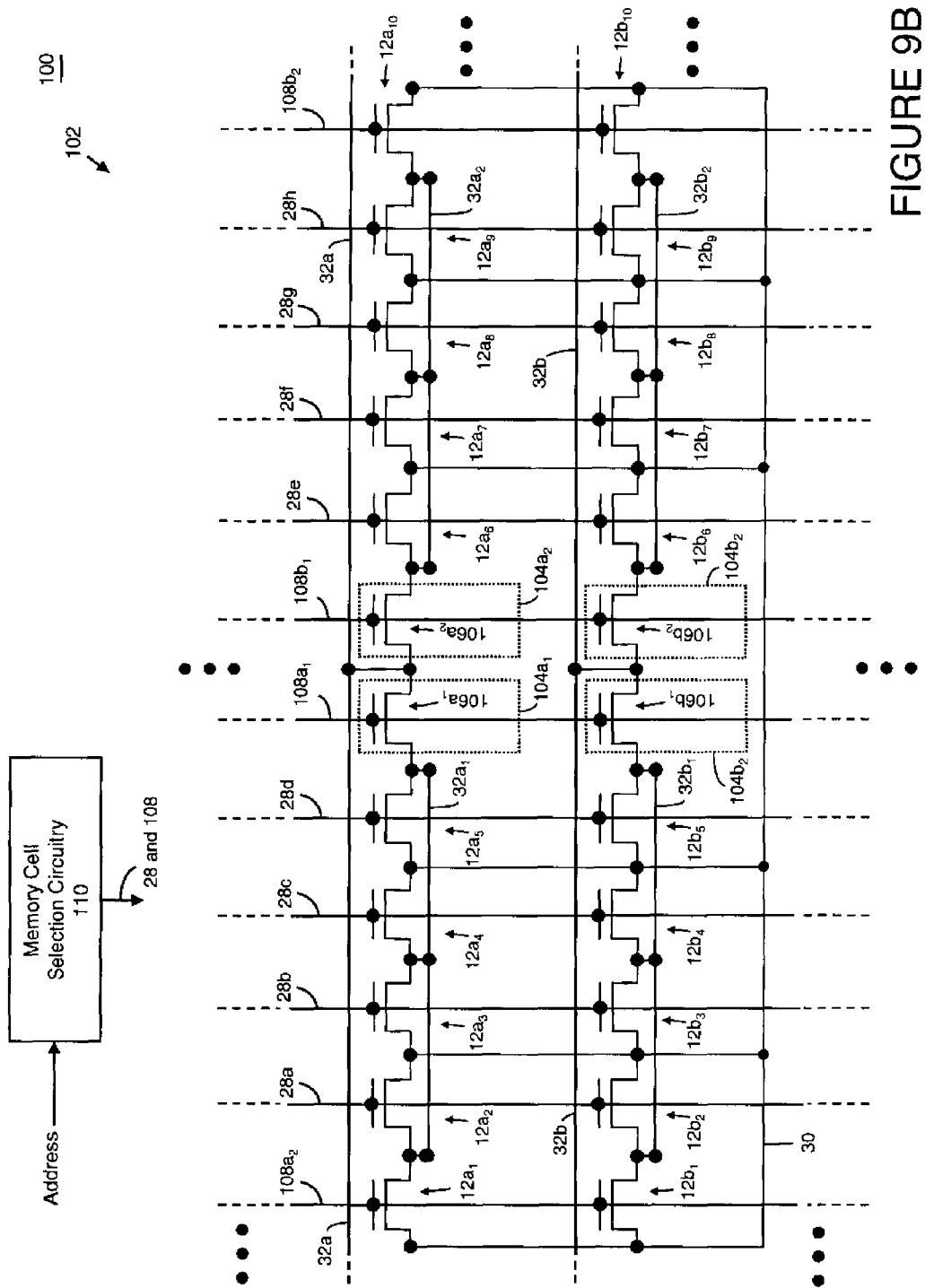

Notably, as mentioned above, the present inventions may include an even number of memory cells 12 associated with a given bit line segment $32a_x$ or an odd number of memory cells 12 associated with a given bit line segment $32a_x$. (see, for example, FIG. 9A (wherein three memory cells are associated with each bit line segment) and FIG. 9B (wherein five memory cells are associated with each bit line segment)).

Where an odd number of memory cells 12 are connected with a given bit line segment $32a_x$, the efficiency of memory cell array 102 may be improved and/or enhanced since memory cells 12 of adjacent or neighboring bit line segments $32a_x$ and $32a_{x+1}$ may share a common region (for example, source region) and/or contact area. Moreover, an odd number of memory cells 12 per bit line segment $32a_x$ may also be advantageous for implementing parity or ECC (error correction code) techniques wherein one of the memory cells coupled to the bit line segment $32a_x$ may be employed for parity or ECC.

Indeed, while many of the embodiments illustrated herein provide four memory cells connected to an associated bit line segment, any number of memory cells (including 1, 2, 3, 4, 5, 6, 7, 8, 9 10, 11, etc.) may be associated with a given bit line segment. All embodiments and/or features described and illustrated herein may be implemented with an even number of memory cells (for example, 2, 4, 6, 8, 10, 12, etc.) or odd number of memory cells (for example, 1, 3, 5, 7, 9, 11, 13, etc.) being associated with a predetermined bit line segment. For the sake of brevity, such permutations and combinations are not discussed in detail herein. However, all permutations and combinations of odd or even number of memory cells associated with a bit line segment, in conjunction with the embodiments and/or features described and illustrated herein, are intended to fall within the scope of the present inventions.

Figure 10A:
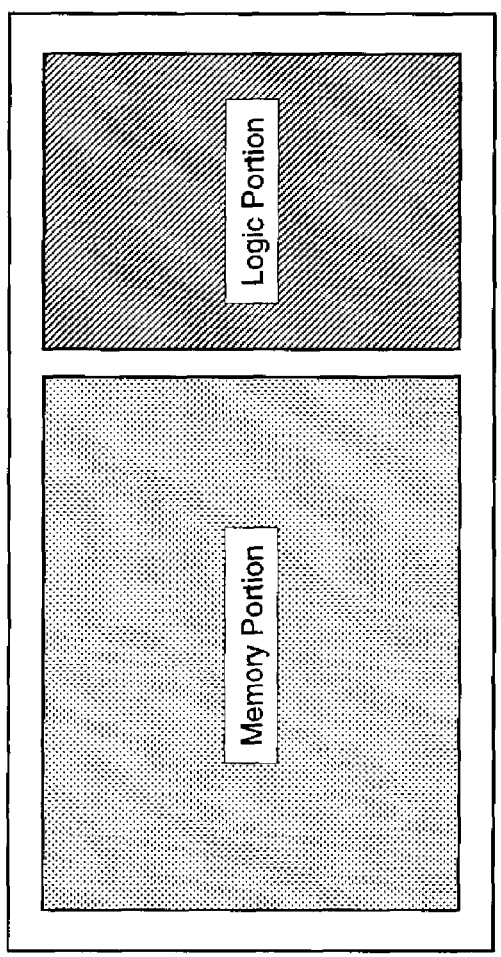
Figure 10B:
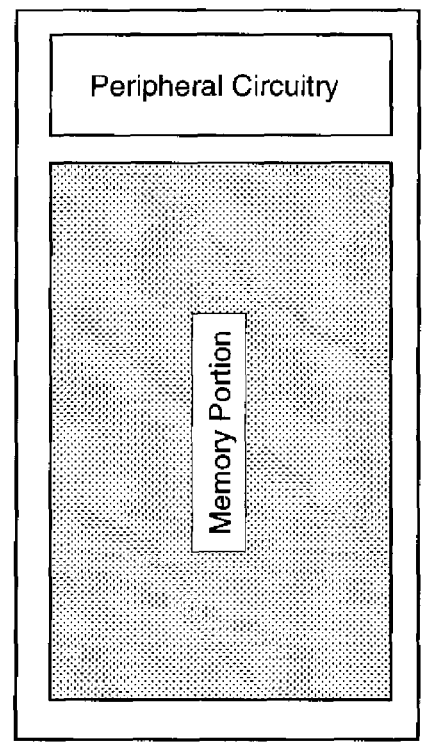
Figure 10C:
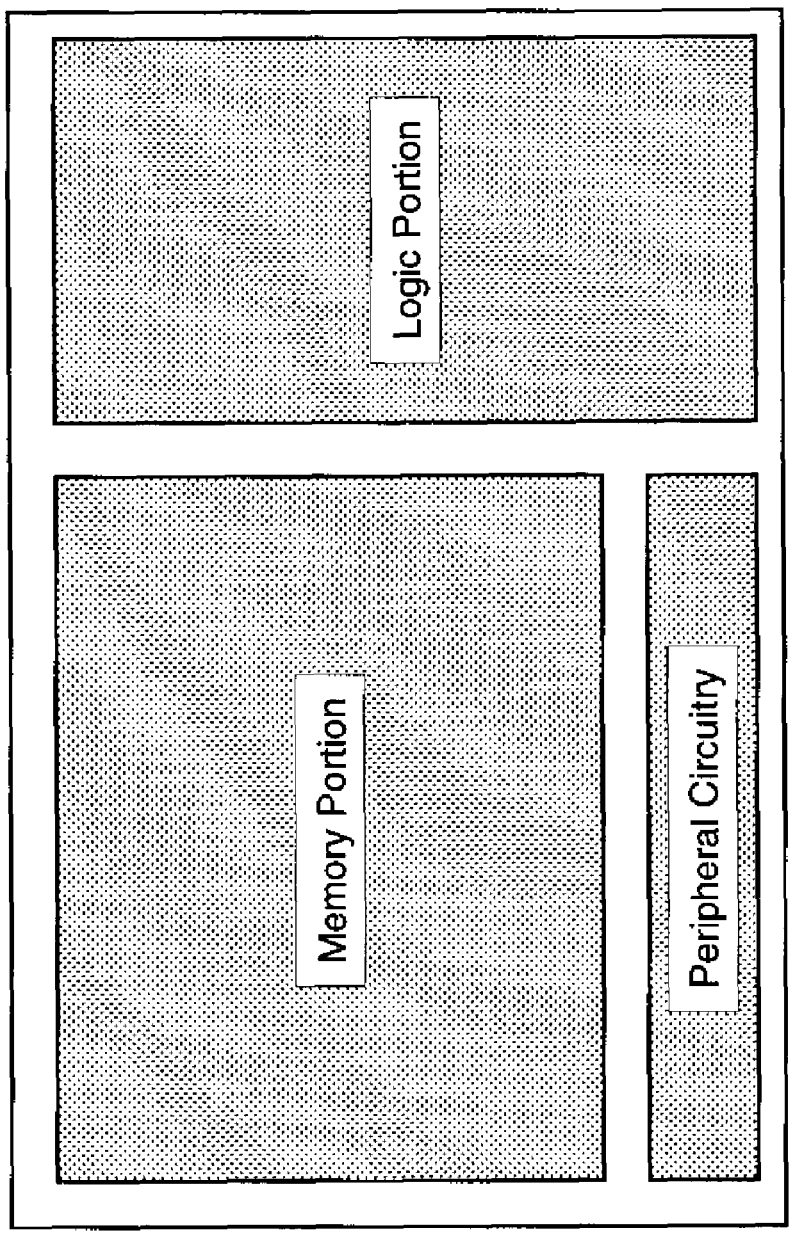

As mentioned above, the present inventions may be implemented in a logic device having a memory portion and logic portion (see, for example, FIGS. 10A and 10C), or an integrated circuit that is primarily a memory device (see, for example, FIG. 10B). The logic device may be, for example, a processor, controller, field programmable gate array, state machine, and/or a device including same. Indeed, the present inventions may be implemented in any device employing a memory cell array.

Figure 11A:
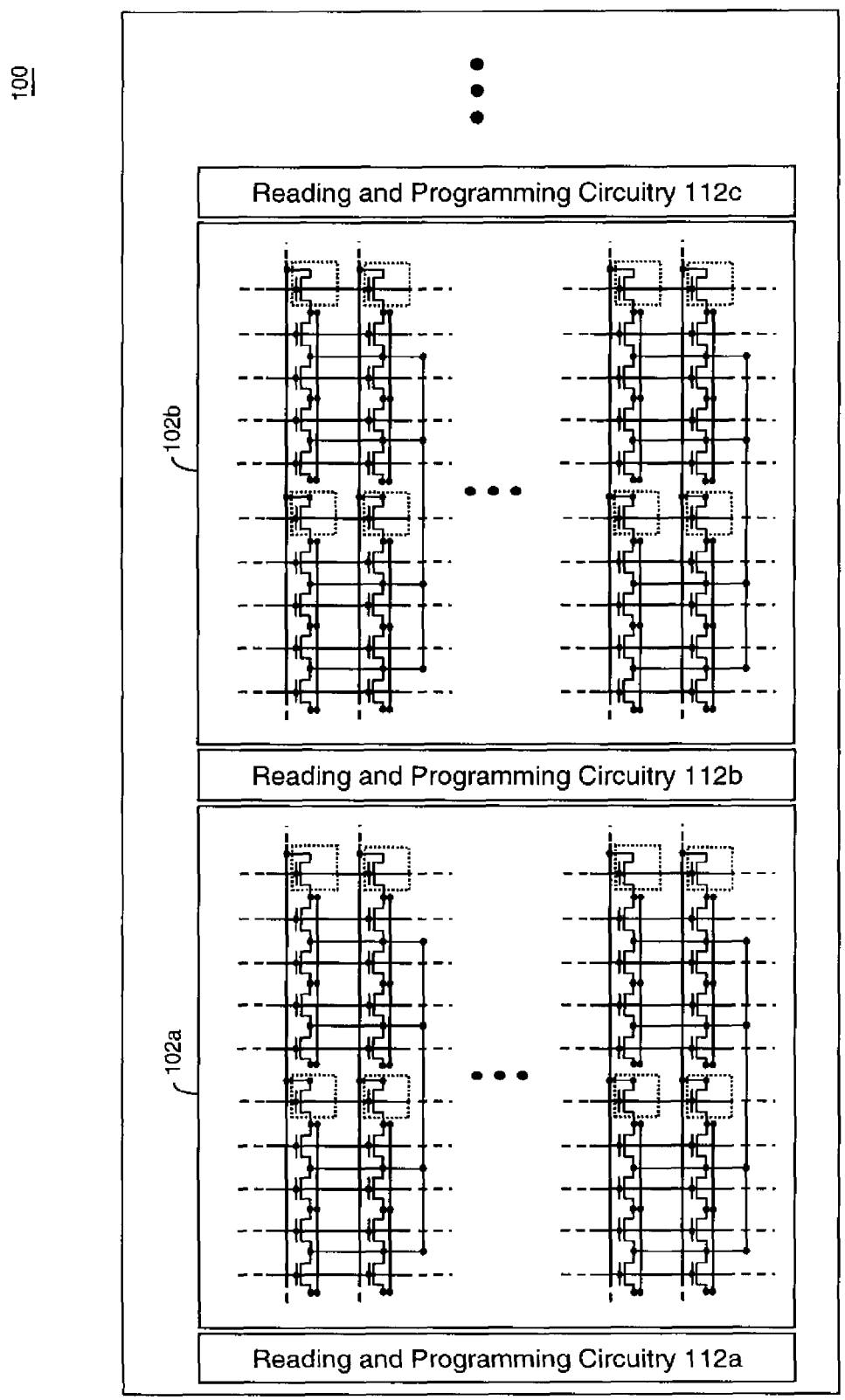

Indeed, the present inventions may be implemented in any configuration and/or arrangement of memory cell array 102 and reading and programming circuitry 112. In this regard, integrated circuit device 100 (for example, memory or logic device) may include a plurality of memory cell arrays 12a-12x, each having corresponding reading and programming circuitry 112a-112x. Moreover, as illustrated in FIG. 11A, adjacent arrays 10a and 10b may share reading and programming circuitry 112b. Alternatively, with reference to FIG. 11B, integrated circuit device 100 may include memory array 102 which is connected to reading and programming circuitry 112a and 112b. In this embodiment, memory array 102 may be embedded memory within an integrated circuit device 100 which includes complex and/or extensive logic circuitry (not illustrated). Moreover, integrated circuit 100 may include a plurality of arrays 10a and 10b, connected to reading and programming circuitry 112a-112d, respectively. The reading and programming circuitry 112a-112d may be located or disposed at the edges and in the center of the associated arrays 102a and 102b, respectively. (See, for example, FIG. 11C).

Notably, the present inventions may be implemented in conjunction with any memory cell technology, whether now known or later developed. For example, the memory cells may include one or more electrically floating body transistors, one transistor-one capacitor architecture, electrically floating gate transistors, junction field effect transistors (often referred to as JFETs), or any other memory/transistor technology whether now known or later developed. All such memory technologies are intended to fall within the scope of the present inventions.

Further, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one electrically floating body transistor which stores an electrical charge in the electrically floating body region of the transistor. One type of such memory cell is based on, among other things, a floating body effect of semiconductor on insulator (SOI) transistors. (See, for example, (1) U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) U.S. Non-Provisional patent application Ser. No. 11/633,311, Okhonin, filed Dec. 4, 2006 and entitled "Electrically Floating Body Memory Cell and Array, and Method of Operating or Controlling Same", (5) U.S. Non-Provisional patent application Ser. No. 11/703,429, Okhonin et al., filed on Feb. 7, 2007 and entitled "Multi-Bit Memory Cell Having Electrically Floating Body Transistor, and Method of Programming and Reading Same", and (6) U.S. Non-Provisional patent application Ser. No. 11/796,935, Okhonin et al., filed on Apr. 30, 2007 and entitled "Semiconductor Memory Cell and Array Using Punch-Though to Program and Read Same"). In this regard, the memory cell may consist of one or more PD and/or FD SOI transistor (or one or more transistors formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

As mentioned above, the memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors (including, for example, transistors formed in bulk, PD SOI, FD SOI and/or combinations thereof). Where N-channel type transistors or P-channel type transistors are employed as the memory cells in the memory array(s), suitable write and read voltages are well known to those skilled in the art (and in view of the U.S. patents and U.S. patent applications incorporated herein by reference).

Moreover, the present inventions may be implemented in conjunction with any memory cell array architecture and/or control technique. For example, the present inventions may be employed or implemented in conjunction with one or more of the memory cell arrays and/or techniques for programming, reading, controlling and/or operating a memory cell and memory cell array including, for example, (1) Okhonin et al., U.S. Patent Application Publication No. 2006/0131650 ("Bipolar Reading Technique for a Memory Cell Having an Electrically Floating Body Transistor"), (2) Okhonin et al., U.S. Patent Application Publication No. 2007/0058427 ("Memory Cell and Memory Cell Array Having an Electrically Floating Body Transistor, and Methods of Operating Same"), (3) U.S. Non-Provisional patent application Ser. No. 11/633,311, Okhonin, filed Dec. 4, 2006 and entitled "Electrically Floating Body Memory Cell and Array, and Method of Operating or Controlling Same", and (4) U.S. Non-Provisional Patent application Ser. No. 11/703,429, Okhonin et al., filed on Feb. 7, 2007 and entitled "Multi-Bit Memory Cell Having Electrically Floating Body Transistor, and Method of Programming and Reading Same". The entire contents of these U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

In addition, the memory cells and/or memory cell arrays may be configured and/or controlled using any of the memory cell arrays, architectures and/or control/operation techniques described and illustrated in the following U.S. patent applications:

(1) application Ser. No. 10/450,238, which was filed by Fazan et al. on Jun. 10, 2003 and entitled "Semiconductor Device" (now U.S. Pat. No. 6,969,662);

(2) application Ser. No. 10/487,157, which was filed by Fazan et al. on Feb. 18, 2004 and entitled "Semiconductor Device" (now U.S. Pat. No. 7,061,050);

(3) application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) application Ser. No. 10/840,009, which was filed by Ferrant et al. on May 6, 2004 and entitled "Semiconductor Memory Device and Method of Operating Same" (U.S. Patent Application Publication US 2004/0228168);

(5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298); and (6) application Ser. No. 11/724,552, which was filed by Carman on Mar. 15, 2007 and entitled "Memory Array Having a Programmable Word Length, and Method of Operating Same".

The entire contents of these six (6) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference.

Notably, the present inventions may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in U.S. patent application entitled "Integrated Circuit Device, and Method of Fabricating Same", which was filed on Jul. 2, 2004, by Fazan, Ser. No. 10/884,481 (U.S. Patent Application Publication US 2005/0017240) and/or U.S. patent application entitled "One Transistor Memory Cell having a Strained Electrically Floating Body Region, and Method of Operating Same", which was filed on Oct. 12, 2006, and assigned Ser. No. 11/580,169 (U.S. Patent Application Publication US 2007/0085140), by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, in one embodiment, an integrated circuit device includes memory section (having a plurality of memory cells, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors—not illustrated)). Moreover, as noted above, the memory cell and/or memory cell array, as well as the circuitry of the present inventions may be implemented in an integrated circuit device having a memory portion and a logic portion (see, for example, FIGS. 10A and 10C), or an integrated circuit device that is primarily a memory device (see, for example, FIG. 10B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Figure 12A:
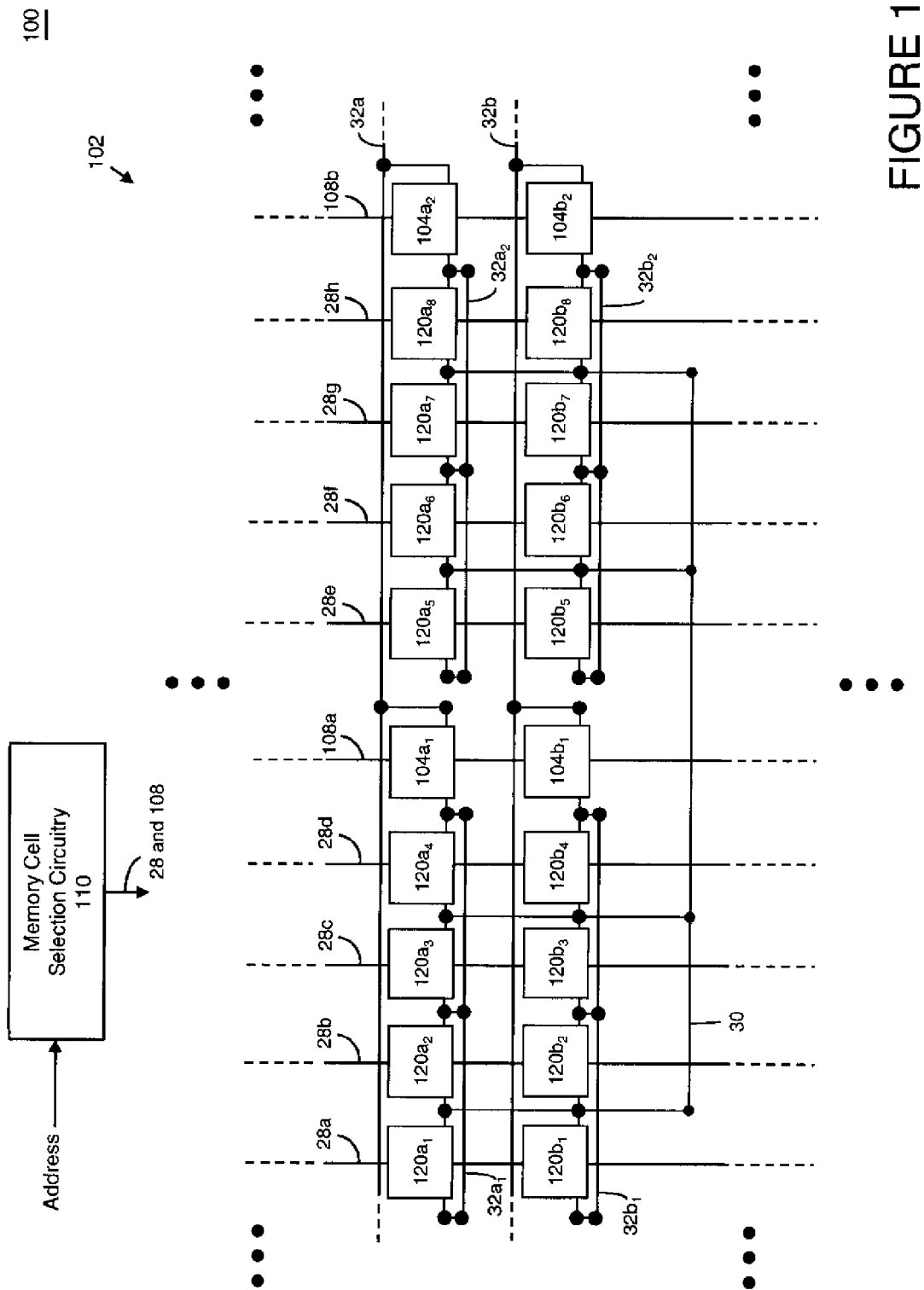
FIGS. 12A and 12B is a schematic block diagram illustration of a portion of an exemplary memory cell array including an exemplary segmented bit line architecture in conjunction with isolation circuits, according to certain aspects of the present inventions, wherein the memory cells may be any memory cell technology.
Figure 12B:
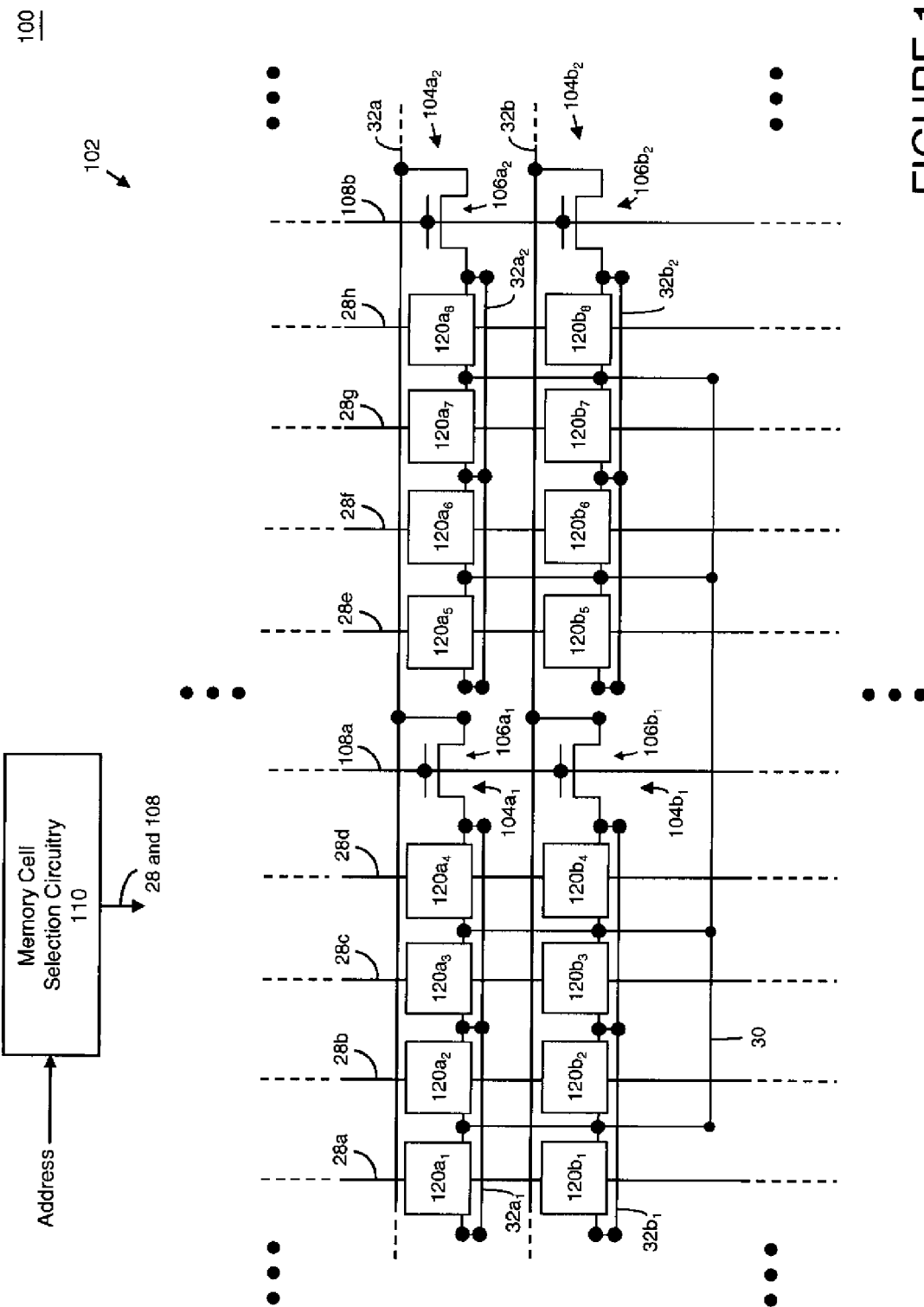

For example, with reference to FIGS. 12A and 12B, the present inventions may be implemented in conjunction with memory cells 120 which implement any memory cell technology that generates at least two current or voltage values (each current or voltage being representative of, for example, a respective data state) and employs a reference to discriminate such data states. The reference may be a current, voltage and/or time or temporal value (i.e., wherein a data state is determined based on detecting a signal within a given or predetermined period of time (for example, a logic high when a signal is detected with the given or predetermined period of time and a logic low when the signal is not detected with the given or predetermined period of time)).

For example, memory cells 120 may be comprised of electrically floating gate transistors, junction field effect transistors (often referred to as JFETs), or any other memory/transistor technology whether now known or later developed. All such memory technologies are considered to fall within the scope of the present inventions. Indeed, such memory cells may be employed in any of the embodiments described and/or illustrated herein. Indeed, all permutations and combinations of such memory cells with such embodiments and/or features thereof, are intended to fall within the scope of the present inventions. For the sake of brevity, such permutations and combinations are not discussed in detail herein.

Notably, where electrically floating body transistor 14 are employed, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel type transistor of the memory cell (whether the source and drain regions are interchangeable or not) is that region of the transistor that is connected to the bit line/sense amplifier.

As mentioned above, the inventions (and embodiments thereof) described and illustrated herein are entirely applicable to N-channel and/or P-channel type transistors. Moreover, while the discussion described and illustrated only source and drain implants, other implants may also be included. For example, implants to modify the operation of memory cells 12, which affect, for example, the power consumption of memory cells 12 as described and illustrated in (1) Fazan et al., U.S. Pat. No. 6,969,662, entitled "Semiconductor Device", (2) Fazan et al., U.S. Pat. No. 7,061,050 entitled "Semiconductor Device"; and (3) Provisional Application Ser. No. 60/578,631, which was filed on Jun. 10, 2004, and entitled "Asymmetrical Electrically Floating Body Memory Device, and Method of Manufacturing Same".

Further, as mentioned above, the memory arrays may be comprised of N-channel type transistors, P-channel type transistors and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Pat. No. 7,061,050). All such techniques, whether now known or later developed, are intended to fall within the scope of the present inventions.

Notably, memory cell selection circuitry 110 may employ any circuitry and/or technique now known or later developed to select one or more memory cells for reading and/or programming. (See, for example, FIGS. 13A, 13B and 13C). Indeed, all such techniques and circuitry therefor, whether now known or later developed, are intended to fall within the scope of the present inventions.

In addition, reading and programming circuitry 112 may include output pass gates, latches and/or column switch circuitry to facilitate and/or implement read and write operations to memory cells 12. There are many different configurations and techniques (and circuitry therefor) to implement such circuitry. All such configurations and techniques, whether now known or later developed, are intended to fall within the scope of the present inventions.

Further, reference generator circuitry 116 is described in the context of generating, providing and/or supplying a reference current or voltage. The reference current or voltage may be substantially equal to one-half of the summation of the currents in a first reference cell, which has a logic low data state, and a second reference cell, which has a logic high data state. Other circuitry and techniques may be employed to generate the reference currents used by data sense amplifier circuitry to sense, sample and/or determine the data state of a selected memory cell 12. Indeed, all such reference current generation techniques and circuitry therefor, whether now known or later developed, are intended to be within the scope of the present inventions.

For example, the circuitry and techniques described and illustrated in U.S. Pat. No. 6,912,910 ("Reference Current Generator, and Method of Programming, Adjusting and/or Operating Same", filed May 7, 2004), may be employed to generate an appropriate reference current for data sense amplifier circuitry. The entire contents of U.S. Pat. No. 6,912,910, including, for example, the inventions, features, attributes, architectures, configurations, materials, techniques and advantages described and illustrated therein, are hereby incorporated by reference herein.

In addition, the present inventions may employ the circuitry and techniques for generating a reference current for data sense amplifier circuitry 102 as described and illustrated in U.S. patent application Ser. No. 11/515,667, which was filed by Bauser on Sep. 5, 2007, and entitled "Method and Circuitry to Generate a Reference Current for Reading a Memory Cell, and Device Implementing Same" (U.S. Patent Application Publication US 2007/0064489). The entire contents of U.S. patent application Ser. No. 11/515,667, including, for example, the inventions, features, attributes, architectures, configurations, materials, techniques and advantages described and illustrated therein, are hereby incorporated by reference herein.

Further, the present inventions may employ the circuitry and techniques for independently controlling certain parameters (for example, temporal or voltage), for a memory operation (for example, restore, write, refresh), to program or write a predetermined data state into a memory cell (for example, programming or writing data state "1" or "0" into a memory cell) as described and illustrated in U.S. patent application Ser. No. 11/590,147, which was filed by Popoff et al. on Oct. 31, 2006, and entitled "Method and Apparatus for Varying the Programming Duration and/or Voltage of an Electrically Floating Body Transistor, and Memory Cell Array Implementing Same". For example, the duration of programming/writing/refreshing of a given memory state into a memory cell by data write and sense circuitry may be controlled, adjusted, determined and/or predetermined according to or based on the given memory operation (for example, restore, write, refresh). Likewise, the voltage conditions applied to the memory cell for programming/writing a given memory state into a memory cell by data write and sense circuitry may be controlled and/or adjusted according to the memory operation (for example, restore, write, refresh). The entire contents of U.S. patent application Ser. No. 11/590,147, including, for example, the inventions, features, attributes, architectures, configurations, materials, techniques and advantages described and illustrated therein, are hereby incorporated by reference herein.

In addition, the present inventions may be employed in conjunction with the circuitry and techniques for generating a voltage, for example, for use during a memory operation (for example, restore, write, refresh) to program or write a data state into a memory cell (for example, programming or writing data state "1" or "0" into a memory cell) as described and illustrated in U.S. Provisional Patent Application Ser. No. 60/932,223, which was filed by Fisch and Bauser on May 30, 2007, and entitled "Integrated Circuit Having Voltage Generation Circuitry for Memory Cell Array, and Method of Operating and/or Controlling Same". For example, may employ the structure and capacitance of the memory cell array to generate and/or provide one or more voltages used during one or more memory operations. The structure and capacitance of the memory cell array may be modified, changed and/or configured via controlling the number of bit line segments that are connected to the associated bit lines. By connecting one or more bit line segments to a bit line, the capacitance of a predetermined and selected portion the memory cell array can be changed or adjusted. As noted therein, the voltage generation circuitry of the present inventions may be implemented in a local manner (i.e., using two or more bit lines of an array or sub-array) and/or in a more global manner (i.e., using all or substantially all of an array or sub-array) without consuming a significant area of the integrated circuit. Implementing the present inventions in conjunction with the circuitry and techniques of U.S. Patent Application Ser. No. 60/932,223 provides an additional level of controlling the amplitude of the generated voltage. The entire contents of U.S. Patent Application Ser. No. 60/932,223, including, for example, the inventions, features, attributes, architectures, configurations, materials, techniques and advantages described and illustrated therein, are hereby incorporated by reference herein.

The embodiments of the inventions described and illustrated above are merely exemplary. They are not intended to be exhaustive or to limit the inventions to the precise forms, techniques, materials and/or configurations disclosed. Many modifications and variations are possible in light of this disclosure. For example, while many of the embodiments illustrate four memory cells connected to an associated bit line segment, any number of memory cells (including 1, 2, 3, 4, 5, 6, 7, 8, 9 10, 11, etc.) may be associated with a given bit line segment. Thus, it is to be understood that other embodiments may be utilized and operational changes may be made without departing from the scope of the present inventions. The scope of the inventions is not limited solely to the description above because the description of the above embodiments has been presented for the purposes of illustration and description.

Figure 7D:
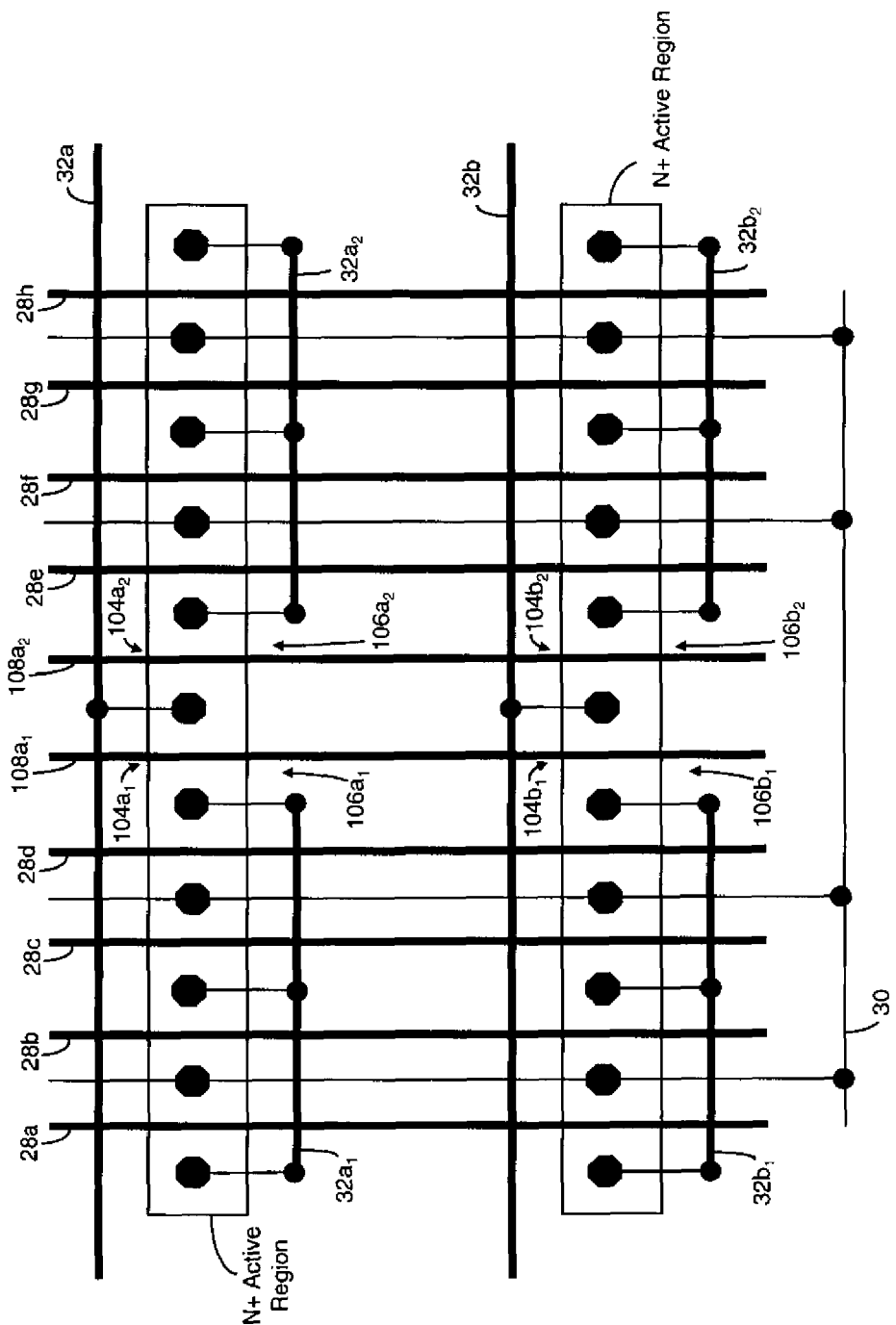
FIG. 7D is a plan view an exemplary layout (not drawn to scale) of a portion of the memory cell array of FIG. 7A illustrating the segmented bit line architecture and isolation circuit, according to certain aspects of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For example, the present inventions may employ an isolation circuit (including, for example, a CMOS type (see FIG. 7D) which may or may not include a clamp transistor (see FIG. 8A)) in conjunction with any layout (for example, a mirror type layout (see FIG. 7B)). For the sake of brevity, many of those permutations and combinations are not discussed separately herein.

Further, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

For example, although much of the discussion above describes a "default" condition whereby the bit line segments $32x_n$ are disconnected from the associated bit line $32x$, the "default" condition may include bit line segments $32x_n$ that are connected to their respective associated bit lines $32x$—for example, during "inactive" memory cycles. As such, during an active cycle, the selected/decoded bit line segment(s) may remain connected to the associated bit line and all unselected or unaddressed segments $32x_n$ may be isolated from the associated bit lines $32x$ via (disabling or enabling) the associated isolation circuits 104. As such, in this embodiment, the bit line segments are connected to their respective associated until the associated isolation circuits are disabled (or enabled depending on the type of isolation circuit employed) thereby disconnecting unselected or unaddressed bit line segments form their associated bit line. Notably, this embodiment may be implemented in any and all of the embodiments discussed above. For the sake of brevity, such discussions will not be repeated.

It should be noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

In sum, an isolation circuit disposed between the bit line and a subset of the floating body memory cells may alleviate, minimize, manage and/or control disturbance on the bit line of other memory cells. The use of an isolation circuit in this manner provides a plurality of bit line segments, associated with a given bit line, which are selectively and responsively coupled to the associated bit line via the isolation circuit. This architecture may provide the advantage of allowing longer bit lines which improves array utilization. Indeed, the segmented bit line architecture of the present inventions may enhance the burst read and write operations where the memory cells of an associated bit line segment may be read or written in a burst read or burst write manner via, among other things, enabling the associated isolation circuit.

What is claimed is:

1. An integrated circuit device comprising:
a memory cell array comprising:
  a plurality of bit lines;
  a plurality of bit line segments, wherein at least two bit line segments are associated with each of the plurality of bit lines, and wherein each of the plurality of bit line segments is configured to be selectively and responsively coupled to or decoupled from an associated bit line;
  a plurality of word lines; and
  a plurality of memory cells, wherein each of the plurality of memory cells stores at least two data states and comprises a transistor, wherein the transistor comprises:
    a first region coupled to an associated bit line segment;
    a second region;
    a body region disposed between the first region and the second region; and
    a gate coupled to an associated word line;
    wherein: (i) a first group of memory cells is coupled to a first bit line via a first bit line segment; and (ii) a second group of memory cells is coupled to the first bit line via a second bit line segment; and
a plurality of isolation circuits, wherein each of the plurality of isolation circuits is associated with a bit line segment and is disposed between the associated bit line segment and an associated bit line, and comprises a transistor comprising: (i) a first region coupled to the associated bit line; (ii) a second region coupled to the associated bit line segment; (iii) a body region disposed between the first region and the second region; and (iv) a gate configured to receive a control signal, wherein: (i) a first isolation circuit is disposed between the first bit line segment and the first bit line; and(ii) a second isolation circuit is disposed between the second bit line segment and the first bit line.

2. The integrated circuit device of claim 1, wherein the first group of memory cells comprises an odd number of memory cells and the second group of memory cells comprises an odd number of memory cells.

3. The integrated circuit device of claim 1, wherein the plurality of memory cells further comprises a third group of memory cells coupled to a second bit line via a third bit line segment, and a fourth group of memory cells coupled to the second bit line via a fourth bit line segment.

4. The integrated circuit device of claim 3, wherein the third group of memory cells comprises an odd number of memory cells and the fourth group of memory cells comprises an odd number of memory cells.

5. The integrated circuit device of claim 1, wherein the plurality of isolation circuits further comprises a third isolation circuit that is disposed between the third bit line segment and the second bit line, and a fourth isolation circuit that is disposed between the fourth bit line segment and the second bit line.

6. The integrated circuit device of claim 1, wherein the transistor of the first isolation circuit and the transistor of the second isolation circuit share a first region.

7. The integrated circuit device of claim 1, wherein each of the plurality of isolation circuits further comprises a second transistor comprising: (i) a first region coupled to the associated bit line segment; (ii) a second region coupled to a predetermined voltage; (iii) a body region disposed between the first region and the second region; and (iv) a gate configured to receive a control signal.

8. The integrated circuit device of claim 7, wherein: (i) the first transistor is a P-type or an N-type transistor; and (ii) the second transistor is a P-type or an N-type transistor.

9. The integrated circuit device of claim 1, wherein each of the plurality of isolation circuits comprises a plurality of transistors comprising the first transistor and a second transistor, wherein the first and second transistors are arranged in a CMOS configuration.

10. The integrated circuit device of claim 1, wherein at least one memory cell of the first group of memory cells shares a common region with at least one memory cell of the second group of memory cells.

11. The integrated circuit device of claim 1, further comprising data sense circuitry coupled to the first bit line to sense data states stored in selected memory cells of the first group of memory cells and the second group of memory cells.

12. A memory device comprising:
a plurality of floating body memory cells, wherein each of the plurality of floating body memory cells comprises a transistor and is configured to store at least two data states, wherein the transistor of each of the plurality of floating body memory cells comprises:
 a source region;
 a drain region;
 a body region configured to store charge carriers, wherein the amount of charge carriers stored in the body region is representative of the data state of each of the plurality of floating body memory cells; and
 a gate;
a plurality of bit lines;
a plurality of bit line segments, wherein each of the plurality of bit line segments is configured to be selectively and responsively coupled to or decoupled from an associated bit line via an isolation circuit; and
a plurality of word lines coupled to the gate of each of the plurality of floating body memory cells.

13. The memory device of claim 12, wherein the plurality of floating body memory cells comprises a first group of floating body memory cells coupled to a first bit line via a first bit line segment and a second group of floating body memory cells coupled to the first bit line via a second bit line segment.

14. The memory device of claim 13, wherein the first group of floating body memory cells comprises forming an odd number of floating body memory cells and the second group of floating memory cells comprises forming an odd number of floating body memory cells.

15. The memory device of claim 13, wherein at least one floating body memory cell of the first group of floating body memory cells is formed to share a common region with at least one floating body memory cell of the second group of floating body memory cells.

16. The memory device of claim 12, wherein the plurality of floating body memory cells further comprises a third group of floating body memory cells coupled to a second bit line via a third bit line segment and a fourth group of floating body memory cells coupled to the second bit line via a fourth bit line segment.

17. The memory device of claim 16, wherein the third group of memory cells comprises an odd number of floating body memory cells and the fourth group of memory cells comprises an odd number of floating body memory cells.

18. The memory device of claim 12, wherein the isolation circuit is disposed between an associated bit line segment and the associated bit line.

19. The memory device of claim 18, wherein the isolation circuit comprises a transistor comprising: (i) a first region coupled to the associated bit line; (ii) a second region coupled to the associated bit line segment; (iii) an electrically floating body region disposed between the first region and the second region; and (iv) a gate configured to receive a control signal.

20. The memory device of claim 19, wherein the plurality of isolation circuits further comprises a second transistor comprising: (i) a first region coupled to the associated bit line segment; (ii) a second region coupled to a predetermined voltage; (iii) an electrically floating body region disposed between the first region and the second region; and (iv) a gate configured to receive a control signal.

21. The memory device of claim 20, wherein: (i) the first transistor is a P-type or an N-type transistor; and (ii) the second transistor is a P-type or an N-type transistor.

22. The memory device of claim 12, wherein the isolation circuit comprises a plurality of transistors comprising the first transistor and a second transistor, wherein the first and second transistors are arranged in a CMOS configuration.

* * * * *

UNITED STATES PATENT AND TRADEMARK OFFICE
CERTIFICATE OF CORRECTION

PATENT NO.       : 8,395,937 B2  
APPLICATION NO.  : 13/166291  
DATED            : March 12, 2013  
INVENTOR(S)      : David Fisch et al.

It is certified that error appears in the above-identified patent and that said Letters Patent is hereby corrected as shown below:

In the Claims

In column 24, line 22, in Claim 1, delete "and(ii)" and insert -- and (ii) --, therefor.

Signed and Sealed this
Twenty-eighth Day of May, 2013

Teresa Stanek Rea
*Acting Director of the United States Patent and Trademark Office*